(12) United States Patent
Koelmel et al.

(10) Patent No.: US 8,434,937 B2
(45) Date of Patent: May 7, 2013

(54) METHOD AND APPARATUS FOR DETECTING THE SUBSTRATE TEMPERATURE IN A LASER ANNEAL SYSTEM

(75) Inventors: Blake Koelmel, Mountain View, CA (US); Abhilash J. Mayur, Salinas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 854 days.

(21) Appl. No.: 12/475,404

(22) Filed: May 29, 2009

(65) Prior Publication Data
US 2009/0296774 A1 Dec. 3, 2009

Related U.S. Application Data

(60) Provisional application No. 61/057,688, filed on May 30, 2008.

(51) Int. Cl.
*G01J 5/02* (2006.01)
*H01L 21/00* (2006.01)

(52) U.S. Cl.
USPC ..... 374/121; 374/161; 250/338.1; 250/341.2; 250/341.4; 250/339.04; 438/14

(58) Field of Classification Search .......... 374/120–131, 374/141, 161, 178, 100; 250/338.1, 341.1, 250/341.2, 341.4, 341.8, 339.06, 339.3, 339.04, 250/340, 341.6, 347, 580; 438/14, 16, 18, 438/54, 57
See application file for complete search history.

(56) References Cited

U.S. PATENT DOCUMENTS

| | | | | |
|---|---|---|---|---|
| 5,683,180 A | * | 11/1997 | De Lyon et al. | 374/161 |
| 5,960,158 A | * | 9/1999 | Gat et al. | 392/416 |
| 5,993,059 A | * | 11/1999 | O'Neill et al. | 374/126 |
| 6,110,284 A | * | 8/2000 | Chen et al. | 118/715 |
| 6,534,752 B2 | * | 3/2003 | Camm et al. | 219/497 |
| 6,680,462 B2 | * | 1/2004 | Sakurai et al. | 219/497 |
| 7,543,981 B2 | * | 6/2009 | Timans | 374/129 |
| 7,744,274 B1 | * | 6/2010 | Grek et al. | 374/124 |
| 7,767,927 B2 | * | 8/2010 | Markle | 219/121.62 |

(Continued)

FOREIGN PATENT DOCUMENTS
JP       2003309080       10/2003

OTHER PUBLICATIONS

International Search Report and Written Opinion of the International Searching Authority mailed Jan. 5, 2010 in PCT/US2009/045699.

*Primary Examiner* — Gail Verbitsky
(74) *Attorney, Agent, or Firm* — Patterson & Sheridan, LLP

(57) ABSTRACT

Embodiments of the invention provide a method and an apparatus for detecting the temperature of a substrate surface. In one embodiment, a method for measuring the temperature is provided which includes exposing the surface of the substrate to a laser beam radiating from a laser source, radiating emitted light from a portion of the surface of the substrate, through the shadow ring, and towards a thermal sensor, and determining the temperature of the portion of the surface of the substrate from the emitted light. The substrate may be disposed on a substrate support within a treatment region and a shadow ring may be disposed between the laser source and the surface of the substrate. The shadow ring may be selectively opaque to the laser beam and transparent to the emitted light.

24 Claims, 15 Drawing Sheets

U.S. PATENT DOCUMENTS

| | | |
|---|---|---|
| 2003/0006374 A1* | 1/2003 | McManus ................. 250/338.1 |
| 2005/0272228 A1 | 12/2005 | Ito et al. |
| 2006/0004493 A1 | 1/2006 | Hwang et al. |
| 2006/0084188 A1 | 4/2006 | You et al. |
| 2006/0102607 A1 | 5/2006 | Adams et al. |
| 2006/0222044 A1* | 10/2006 | Melzer et al. .................. 374/45 |
| 2006/0286807 A1 | 12/2006 | Hwang et al. |
| 2008/0111074 A1* | 5/2008 | Weir et al. .................. 250/338.1 |
| 2009/0200279 A1* | 8/2009 | Li ............................. 219/121.66 |

* cited by examiner

METHOD AND APPARATUS FOR DETECTING THE SUBSTRATE TEMPERATURE IN A LASER ANNEAL SYSTEM

CROSS-REFERENCE TO RELATED APPLICATION

This application claims benefit of U.S. Ser. No. 61/057,688 (APPM/011940L), filed May 30, 2008, which is incorporated herein by reference in its entirety.

BACKGROUND OF THE INVENTION

1. Field of the Invention

Embodiments of the invention generally relate to an apparatus and method for manufacturing a semiconductor device. More particularly, the invention is directed to an apparatus and method for thermally processing a substrate.

2. Description of the Related Art

The integrated circuit (IC) market is continually demanding greater memory capacity, faster switching speeds, and smaller feature sizes. One of the major steps the industry has taken to address these demands is to change from batch processing silicon substrates in large furnaces to single substrate processing in a small chamber.

During single substrate processing, the substrate is typically heated to a high temperature to allow various chemical and physical reactions to take place in multiple IC devices disposed within portions of the substrate. Of particular interest, favorable electrical performance of the IC devices requires implanted regions to be annealed. Annealing recreates a crystalline structure from regions of the substrate that were previously made amorphous, and activates dopants by incorporating their atoms into the crystalline lattice of the substrate.

Thermal annealing processes usually provide a relatively large amount of thermal energy to the substrate in a short amount of time, and then rapidly cool the substrate to terminate the thermal process. Examples of thermal annealing processes currently in use include rapid thermal processing (RTP) and impulse (spike) annealing. Conventional RTP processes heat the entire substrate even though the IC devices reside only in the upper surface of the silicon substrate. Therefore, the rate to heat and/or cool the substrate is limited by the size of the substrate. Moreover, once the entire substrate is at an elevated temperature, heat can only dissipate into the surrounding space or structures. As a result, RTP systems usually do not achieve a 400° C./s ramp-up rate or a 150° C./s ramp-down rate. While RTP and spike annealing processes are known, current processes ramp substrate temperatures too slowly during the thermal process and therefore exposes the substrate to elevated temperatures for an extended period of time. These thermal budget problems become more severe with increasing substrate sizes, increasing switching speeds, and/or decreasing feature sizes.

To resolve some of the problems raised in conventional RTP processes, various scanning laser anneal techniques have been used to anneal surfaces of substrates. In general, these techniques deliver a constant energy flux to a small region on the surface of a substrate while the substrate is translated, or scanned, relative to the energy delivered to the small region. Due to stringent uniformity requirements and the complexity of minimizing the overlap of scanned regions across the substrate surface, these types of processes are not effective for thermal processing contact level devices formed on the surface of the substrate.

Dynamic surface annealing (DSA) techniques have been developed to anneal finite regions on the surface of the substrate to provide well-defined annealed and/or re-melted regions on the surface of the substrate. Generally, during such laser anneal processes, various regions on the surface of the substrate are sequentially exposed to a desired amount of energy delivered from the laser to cause the preferential heating of desired regions of the substrate. These techniques are preferred over conventional processes that sweep the laser energy across the surface of the substrate because the overlap between adjacent scanned regions is strictly limited to the unused space between die, or kurf lines, resulting in more uniform annealing across the desired regions of the substrate.

One disadvantage to DSA techniques is that annealing a portion of the surface of the substrate subjects the interface region between annealed portions and non-annealed portions to high thermal stresses during annealing due to temperature differences of up to 500° C. In most cases, these thermal stresses are relieved as heat conducts from the annealed region into the non-annealed region of the substrate. However, as the annealing process moves toward an edge of the substrate, the availability of heat-absorbing substrate domains is reduced by proximity to the edge, and thermal stresses cause physical deformation or breakage of the substrate.

FIG. 1 illustrates an annealing process attempting to anneal a portion 102 of substrate 100 near edge 104 of substrate 100. The electromagnetic energy 106 radiating from source 108 heats portion 102, while edge portion 110 of substrate 100 remains unheated. The interface area between annealed portion 102 and edge portion 110 develops high thermal stress due to the relatively small heat-absorbing capacity of edge portion 110. This high thermal stress is frequently relieved by deformation or breakage in edge portion 110 near edge 104 of substrate 100. Thus, there is a need for a thermal processing apparatus and method capable of annealing any desired region of the substrate without damaging the substrate.

SUMMARY OF THE INVENTION

Embodiments of the invention provide an apparatus and a method for determining the temperature of a substrate. In one embodiment, a method for determining or measuring a temperature of a substrate surface is provided which includes radiating an initial light from a light source towards a surface of a substrate, heating the substrate by exposing the surface of the substrate to the initial light, radiating emitted light from a portion of the surface of the substrate, passing the emitted light through an energy blocker and towards a detector, such as a thermal sensor, and determining a temperature of the portion of the surface of the substrate from the emitted light with the detector or thermal sensor.

The substrate may be disposed on a substrate support within a treatment region and then energy blocker may be disposed between the light source and the surface of the substrate. The light source may be a laser, a lamp, or another source of light. The detector or thermal sensor may be a pyrometer.

Embodiments provide that the energy blocker may be a shadow ring or an edge ring and is usually opaque to the initial light and transparent to the emitted light. Therefore, the initial light may be reflected or absorbed by the energy blocker. The energy blocker contains quartz and has an optical coating of multiple dielectric layers. In some examples, the initial light radiated from the light source may have a wavelength within a range from about 750 nm to about 875 nm, preferably, from about 780 nm to about 830 nm, and more preferably, from about 800 nm to about 815 nm. The emitted light from the surface of the substrate may have a wavelength of less than 800 nm or greater than 815 nm, preferably, less than 775 nm or greater than 850 nm, and more preferably, less than 750 nm or greater than 875 nm.

In another embodiment, the method further provides detecting an edge of the energy blocker within the treatment region to determine the portion of the surface of the substrate. The portion of the surface of the substrate may be an interface between the perimeter edge of the substrate and a shadow cast by the shadow ring. In one example, the method provides detecting the edge of the energy blocker within the treatment region by utilizing a height sensor to detect a change in elevation within the treatment region. In some examples, the substrate support may be a moveable substrate support.

In another embodiment, a method for measuring or determining the temperature is provided which includes exposing the surface of the substrate to a laser beam radiating from a laser source, radiating emitted light from a portion of the surface of the substrate, through the shadow ring, and towards a detector, such as a thermal sensor, and determining the temperature of the portion of the surface of the substrate from the emitted light with the detector or thermal sensor. The substrate may be disposed on a substrate support within a treatment region and a shadow ring may be disposed between the laser source and the surface of the substrate. The shadow ring is usually opaque to the laser beam and transparent to the emitted light. In one example, the laser beam is reflected or absorbed by the shadow ring. The method further includes detecting an edge of the shadow ring within the treatment region to determine the portion of the surface of the substrate.

In another embodiment, a method for measuring a temperature of a substrate surface is provided which includes positioning a substrate on a substrate support and below a shadow ring, wherein the shadow ring is opaque to a first light and transparent to a second light, exposing an upper surface of the substrate to the first light radiating from a light source, emitting the second light from a portion of the surface of the substrate, through the shadow ring, and towards a thermal sensor, and determining a temperature of the portion of the surface of the substrate from the emitted light. In one example, the first light or initial light is a laser beam radiated from a laser source or a lamp, and the second light is emitted light from the surface of the substrate.

In another embodiment, a processing apparatus for treating a substrate and measuring a surface temperature of the substrate is provided which includes a substrate support disposed within a processing body, a laser source positioned to direct a laser beam having a first wavelength towards the substrate support, an optical assembly containing a thermal sensor (e.g., pyrometer) configured to detect light at a second wavelength and coupled with the processing body, and an energy blocker disposed between the laser source and the substrate support and coupled with the processing body. The energy blocker may be a shadow ring or an edge ring and that is selectively opaque to the first wavelength while being transparent to the second wavelength. The first wavelength may be within a range from about 750 nm to about 875 nm and the second wavelength may be less than 800 nm or greater than 810 nm. In some example, the energy blocker contains quartz and has an optical coating of multiple dielectric layers.

In other embodiments, the apparatus contains a substrate support configured to position the substrate for processing, an energy source configured to direct electromagnetic energy towards the substrate support, and one or more energy blockers configured to block at least a portion of the electromagnetic energy. In one example, the energy source may be a laser positioned to emit a light or laser beam towards the substrate support which is partially blocked by a shadow ring or an edge ring.

In one embodiment, the apparatus for determining temperature of a substrate is provided which includes a substrate support disposed below an upper surface of a body within a processing apparatus, two lower rails disposed on the upper surface of the body and extending parallel to each other along the upper surface, an upper rail positioned above the two lower rails and configured to move along the two lower rails, wherein the two lower rails and the upper rail are part of a rail assembly, an optical assembly coupled with the upper rail, wherein the optical assembly contains an energy source, a thermal sensor, and/or a height sensor.

In some embodiments, the optical assembly may be positioned to direct energy from the energy source towards a surface of the substrate support at an angle substantially perpendicular to a plane extending across the surface of the substrate support. In various examples, the energy source may be a laser, the thermal sensor may be a pyrometer, and the height sensor may be a range finder. The range finder may be an acoustic locator or an infrared locator.

In other embodiments, at least one actuator may be coupled with the rail assembly and adapted to position the optical assembly. Also, a controller may be coupled with the at least one actuator and the optical assembly and adapted to control movement of the rail assembly and operation of the optical assembly. In another example, an energy blocker may be coupled with the substrate support and adapted to block at least a portion of the energy emitted by the energy source.

In some examples, the upper rail may be positioned to move along the two lower rails with no or little friction (substantially no friction). In other examples, the substrate support may be a moveable substrate support. In a specific example, the apparatus for determining temperature of a substrate is provided which includes a movable substrate support disposed below an upper surface of a body within a processing apparatus, two lower rails disposed on the upper surface of the body and extending parallel to each other along the upper surface, an upper rail positioned above the two lower rails and configured to move along the two lower rails, wherein the two lower rails and the upper rail are part of a rail assembly, an optical assembly coupled with the upper rail, wherein the optical assembly contains a laser, a thermal sensor, and/or a height sensor, and an energy blocker disposed over the movable substrate support and coupled with the processing apparatus.

In another embodiment, a method for measuring temperature of a substrate surface is provided which includes exposing a surface of a substrate to electromagnetic energy radiating from an energy source, wherein the substrate is disposed on a substrate support within a treatment region, detecting radiation emitted from a portion of the treatment region with a thermal sensor, and determining a temperature of the surface of the substrate at the portion of the treatment region from the emitted radiation with the thermal sensor.

In some embodiments, the method further includes determining the radiation emitted from the surface of the substrate in order to determine the temperature of the surface of the substrate from the emitted radiation. In other embodiments, the method includes comparing the radiation emitted within the treatment region to the portion of the treatment region of the surface of the substrate in order to determine the radiation emitted by the surface of the substrate. In another embodiment, the method includes preventing a secondary radiation from reaching the detector or thermal sensor, where the secondary radiation is emitted from other than the treatment region. In one example, the secondary radiation passes into a filter to prevent the secondary radiation from reaching the detector or thermal sensor.

In another embodiment, an energy blocker may be disposed between the energy source and the surface of the substrate and a first portion of the electromagnetic energy radiates the energy blocker while a second portion of the electromagnetic energy radiates a portion of the surface of the substrate within the treatment region. In some embodiments, the method further includes detecting an edge of the energy blocker within the treatment region to determine the portion of the treatment region. The edge of the energy blocker within the treatment region may be detected by using a height sensor to detect a change in elevation within the treatment region.

In other embodiments, the method further includes comparing the position of the thermal sensor to the position of the energy blocker in order to determine the portion of the treatment region at the surface of the substrate comprises. In other embodiments, the method further includes registering the position of the thermal sensor in local coordinates in order to compare the position of the thermal sensor to the position of the energy blocker. The energy blocker may be adapted to selectively block electromagnetic energy from the energy source. In some examples, the method provides that the electromagnetic energy is a beam of light radiating from a laser. In other examples, the substrate support may be a moveable substrate support.

BRIEF DESCRIPTION OF THE DRAWINGS

So that the manner in which the above recited features of the invention can be understood in detail, a more particular description of the invention briefly summarized above may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide a method and an apparatus for detecting the temperature of a substrate. In some embodiments, the apparatus contains a substrate support configured to position the substrate for processing, an energy source configured to direct electromagnetic energy towards the substrate support, and one or more energy blockers configured to block at least a portion of the electromagnetic energy. In one example, the energy source may be a laser positioned to emit light or a laser beam towards the substrate support which is partially blocked by a shadow ring or an edge ring.

Figure 1:
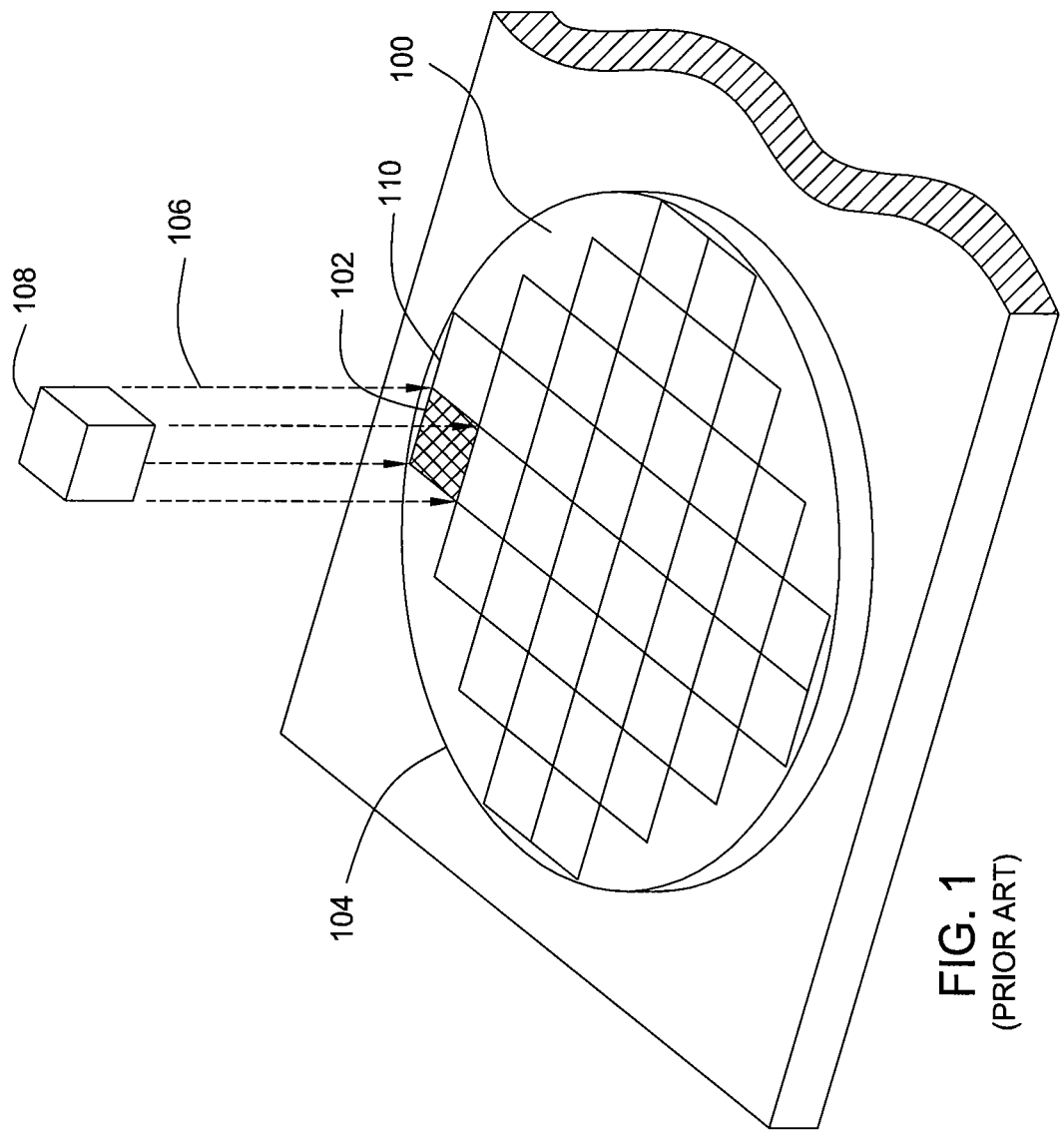
FIG. 1 depicts a prior art representation of a thermal processing apparatus performing thermal treatment of a substrate.
Figure 2A:
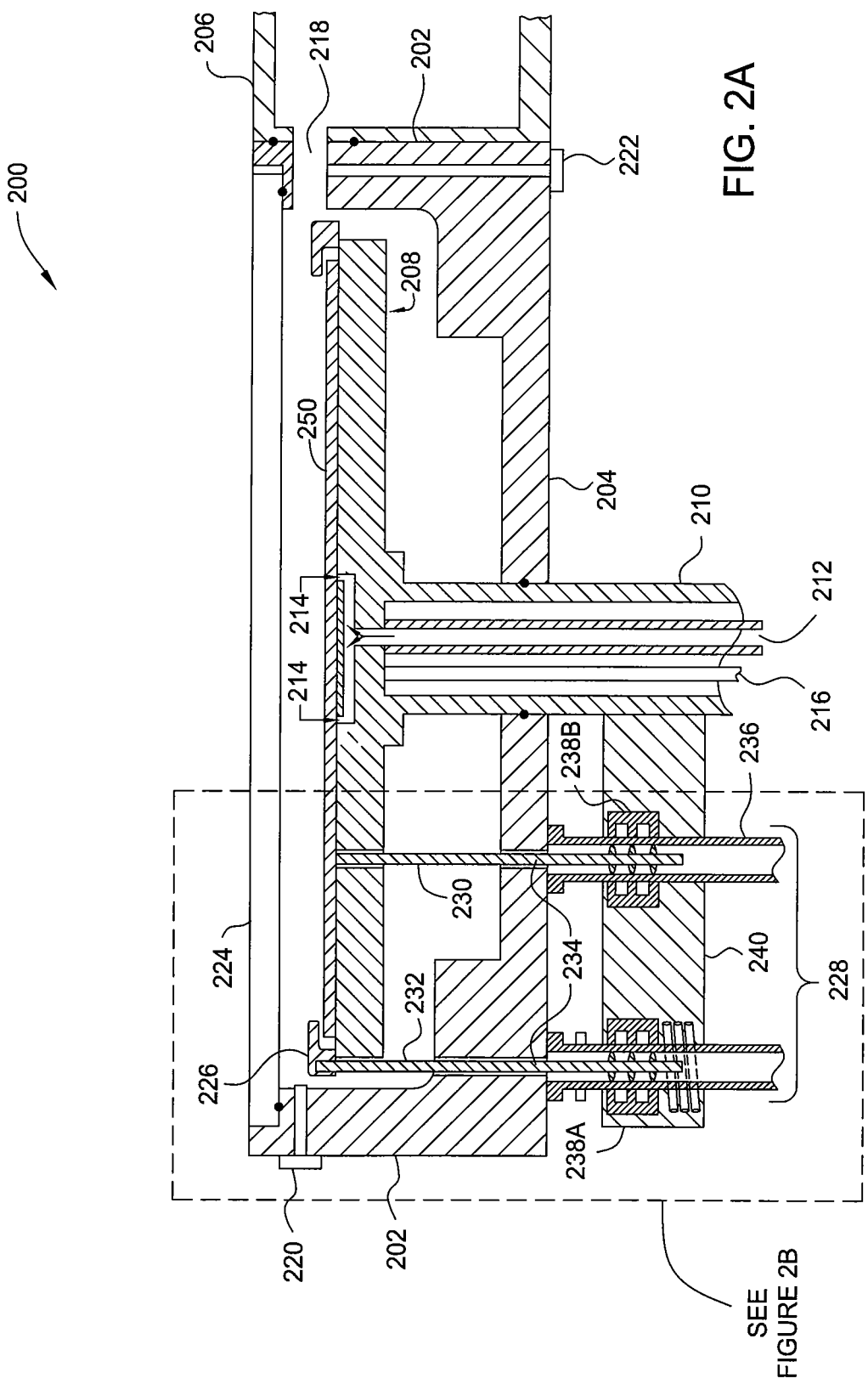
FIG. 2A depicts a cross-section view of an apparatus according to one embodiment described herein.

FIG. 2A is a cross-section view of a thermal processing chamber 200 according to one embodiment of the invention. Chamber 200 features a wall 202, a floor 204, and a top portion 206 cooperatively defining a processing chamber. The processing chamber contains a substrate support 208 for positioning a substrate 250 within the chamber. The substrate support 208 includes a conduit portion 210, which pierces floor 204, for carrying various processing media to and from the substrate support. Conduit portion 210 may include passage 212 for carrying processing media to a surface of substrate support 208 through openings 214. Conduit portion 210 may also include passage 216 for carrying thermal control media to channels inside substrate support 208, enabling the heating or cooling of substrate support 208.

A substrate may be introduced to chamber 200 through portal 218, which may be sealed by a door (not shown) if desired. Process gases may be introduced to the processing chamber through portal 220, and may be evacuated through portal 222, or through any other suitable conduit. In some embodiments, it may be advantageous, for example, to evacuate process gases through a conduit in substrate support 208. In other embodiments, gases may be provided to the back side of a substrate disposed on substrate support 208 through a conduit therein (not shown). Such gases may be useful for thermal control of the substrate during processing in high vacuum. Thermal control gases are generally different from process gases.

Chamber 200 is generally juxtaposed with a source (not shown) for directing electromagnetic energy toward a substrate disposed in chamber 200. In some examples, the source is a laser and the electromagnetic energy is a light beam or a laser beam. Electromagnetic energy is admitted to the processing chamber through window 224 in top portion 206, which may be quartz or another suitable material, for transmitting electromagnetic energy while withstanding processing conditions. Chamber 200 also includes an energy blocker 226 configured to block at least a portion of the electromagnetic energy coming from the source toward substrate support 208. Energy blocker 226 may be a shadow ring or an edge ring.

Chamber 200 also includes a lift pin assembly 228 for manipulating the energy blocker and the substrate inside the apparatus. In one embodiment, lift pin assembly 228 contains a plurality of lift pins 230 for manipulating substrate 250 and a plurality of lift pins 232 for manipulating energy blocker 226. Lift pins may enter chamber 200 through a plurality of passages 234.

Figure 2B:
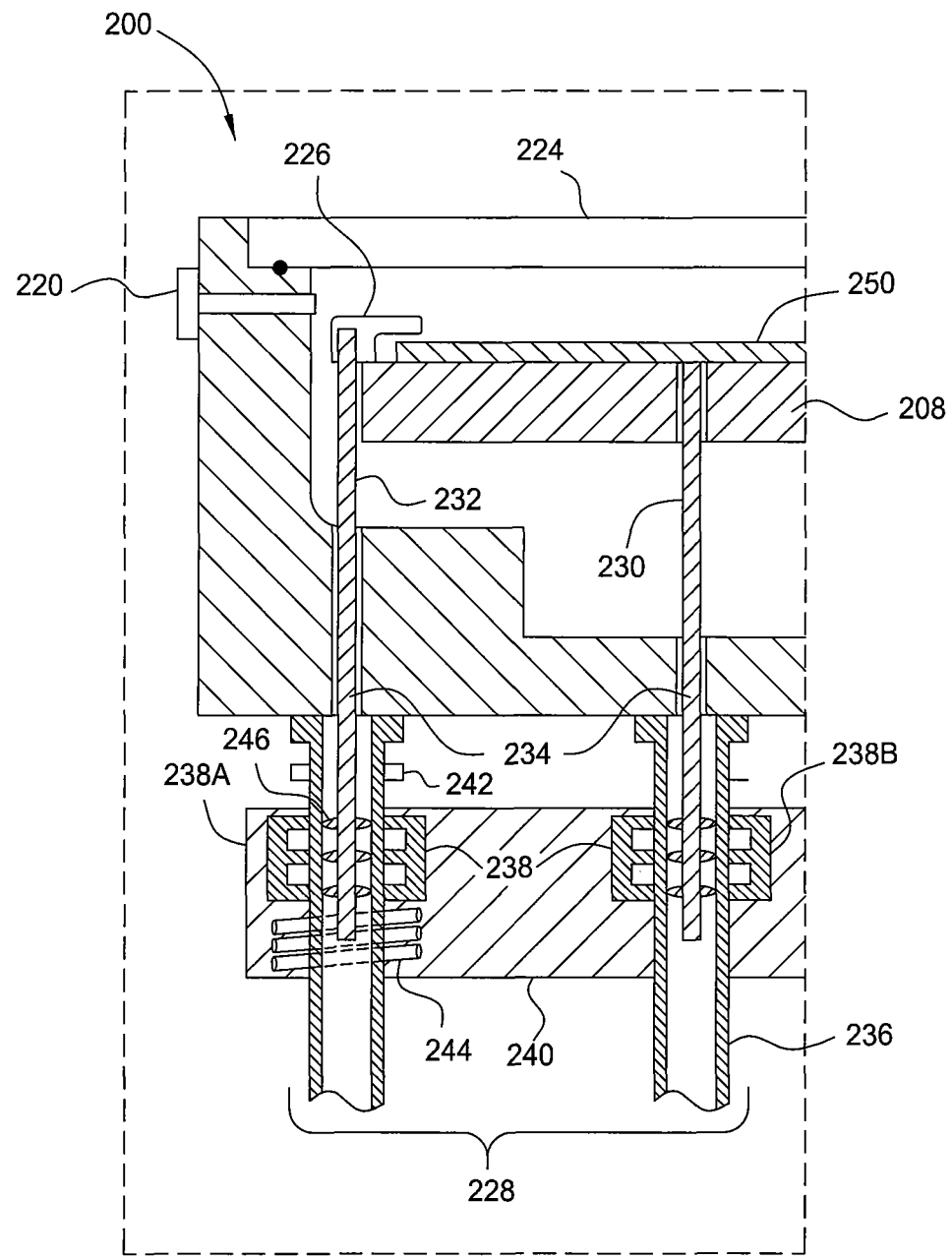
FIG. 2B depicts a detail view of a portion of the apparatus depicted in FIG. 2A, according to another embodiment described herein.

FIG. 2B depicts portions of chamber 200, including window 224, energy blocker 226, portal 220, and lift pin assembly 228. Lift pins 230 and 232 are guided by guide tubes 236, which ensure proper alignment of lift pins 230 and 232. In one embodiment, lift pins 230 and 232 are enclosed by shuttles 246, which contact the inside of guide tubes 236 to maintain alignment of lift pins 230 and 232 with guide tubes 236. Shuttles 246 may contain a rigid material, as well as may contain a low-friction surface for impinging on guide tube surfaces. In one embodiment, shuttles 246 may contain a stainless steel with plastic bushings (not shown) for contacting guide tubes 236. In some embodiments, lift pins 230 and 232 may be manipulated by actuator collars 238, which are magnetically coupled to lift pins 230 and 232 by shuttles 246, as shown in FIG. 2B.

Actuator collars 238 are configured to travel in a longitudinal direction relative to guide tubes 236, extending and retracting lift pins 230 and 232 as needed. An actuator arm moves actuator collars 238 along guide tubes 236 to extend and retract lift pins. In one embodiment, a single actuator arm 240 may operate both sets of lift pins 230 and 232, but multiple actuators arms may be used if desired. Extension of lift pin 232 into chamber 200 is limited by stop 242. A guide tube spring 244 may be provided as shown in FIG. 2B to allow actuator arm 240 to continue moving towards chamber 200 after lift pin 230 has been curtailed by stop 242. Lift pin 230 may continue moving after lift pin 232 has stopped, with a single actuator arm 240 moving both. In one embodiment, lift pin 232 is longer than lift pin 230 to allow lift pin 232 to lift energy blocker 226 before lift pin 230 lifts substrate 250 off of substrate support 208.

Energy blocker 226 is configured to block a portion of the electromagnetic energy (e.g., beam of light or laser) directed toward substrate 250 through window 224. Energy blocker 226 may be configured such that a portion rests on substrate support 208 while another portion extends above a portion of substrate support 208. In some embodiments, energy blocker 226 casts a shadow over the edge of a substrate disposed on substrate support 208. Energy blocker 226 may thus be referred to as a shadow ring or an edge ring. Lift pins may manipulate energy blocker 226 by mating with recesses.

In operation, lift pin 232 extends into the processing chamber, lifting energy blocker 226 above substrate support 208 a sufficient distance to allow manipulation of substrate 250 disposed on substrate support 208 without contacting energy blocker 226. Lift pin 230 extends into the processing chamber to lift substrate 250 above substrate support 208, allowing a substrate handling mechanism (not shown) to enter the processing chamber through portal 218 (FIG. 2A) and access the substrate. As actuator arm 240 moves both lift pins upward, actuator collar 238A impinges stop 242. Actuator arm 240 continues moving, compressing guide tube spring 244 against actuator collar 238A, while actuator collar 238B continues moving lift pin 230 upward. With a substrate handling mechanism extended into the processing chamber, actuator arm 240 retracts lift pin 230 until guide tube spring 244 is fully extended, and then retracts both lift pins 230 and 232 until substrate 250 and energy blocker 226 rests on substrate support 208. In embodiments with a single actuator arm 240, lift pins 230 and 232 extend and retract together. In embodiments with multiple actuators, lift pin 232 may remain extended when no substrate is disposed on substrate support 208. When a substrate is provided to the processing chamber by a handling mechanism, lift pin 230 may then extend to lift the substrate above the handling mechanism, allowing the handling mechanism to retract from the processing chamber through portal 218 (FIG. 2A). Lift pin 230 may then retract to dispose the substrate on substrate support 208. Lift pin 232 may then retract to dispose energy blocker 226 in a processing position.

To remove a substrate from the chamber, lift pins 230 and 232 operate in reverse. In a single-actuator embodiment, both lift pins extend into the processing chamber. Lift pin 232 engages energy blocker 226 first, elevating it above substrate support 208. Lift pin 230 engages substrate 250 a short time later, and both ascend above substrate support 208 by operation of the lift pins 230 and 232. When actuator collar 238A reaches stop 242, lift pin 232 stops ascending, and guide tube spring 244 compresses as actuator arm 240 continues moving upward. As actuator arm 240 continues moving upward, lift pin 230 continues to move, while lift pin 232 remains stationary. Thus, substrate 250, supported by lift pin 232, approaches energy blocker 226. When collar 238B reaches the upper extremity of guide tube 236, actuator arm 240 and lift pin 230 stop moving. A substrate handling apparatus may then extend into the processing chamber. The actuator arm may then descend, lowering substrate 250 onto the substrate handling apparatus for withdrawal from the chamber. In multiple-actuator embodiments, lift pin 232 may remain fully extended while substrate 250 is manipulated from substrate support 208 to the substrate handling apparatus, and while a new substrate is manipulated onto substrate support 208, if desired.

Figure 3A:
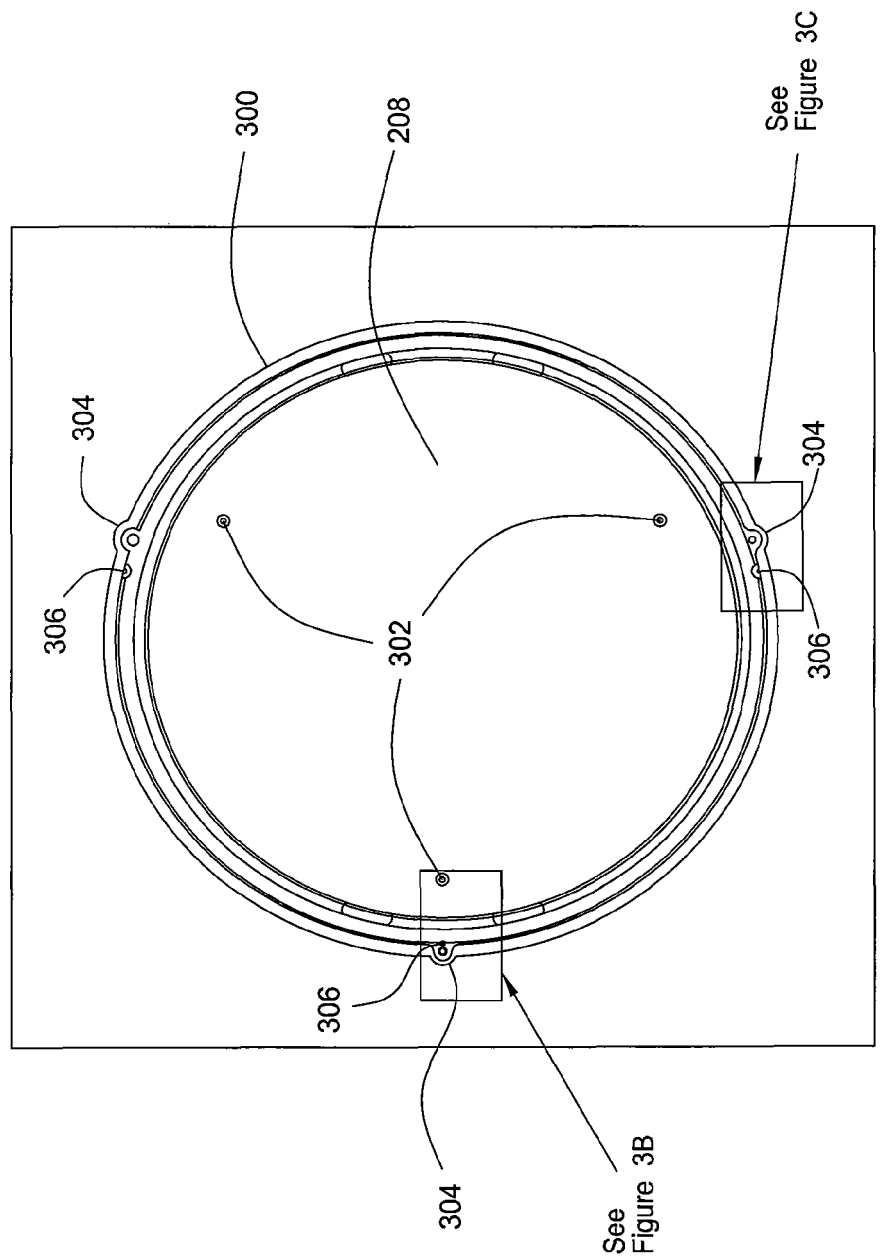
FIG. 3A depicts a top view of an apparatus according to one embodiment described herein.

FIG. 3A illustrates a top view of an energy blocker 300 as described in some embodiments herein. In one embodiment, the energy blocker 300 is a radiation blocker, such as a shadow ring or an edge ring. In this embodiment, energy blocker 300 is a ring, annular in shape and formed as a single article, configured to block some energy being directed toward substrate support 208. In some embodiments, energy blocker 300 may be opaque, while in other embodiments energy blocker 300 may be selectively opaque, such as to be partially transparent to electromagnetic energy of some frequencies or wavelengths while blocking (e.g., reflecting or absorbing) electromagnetic energy of other frequencies or wavelengths. In this embodiment, substrate support 208 features openings 302 to allow lift pins 230 (FIGS. 2A-2B) to deploy from beneath substrate support 208 to manipulate a substrate disposed thereon. In this embodiment, energy blocker 300 features tabs 304 for mating with lift pins 232. The lift pins move energy blocker 300 to allow for translation of a substrate inside the processing chamber. Energy blocker 300 also features alignment points 306 for aligning energy blocker 300 with substrate support 208.

Figure 3B:
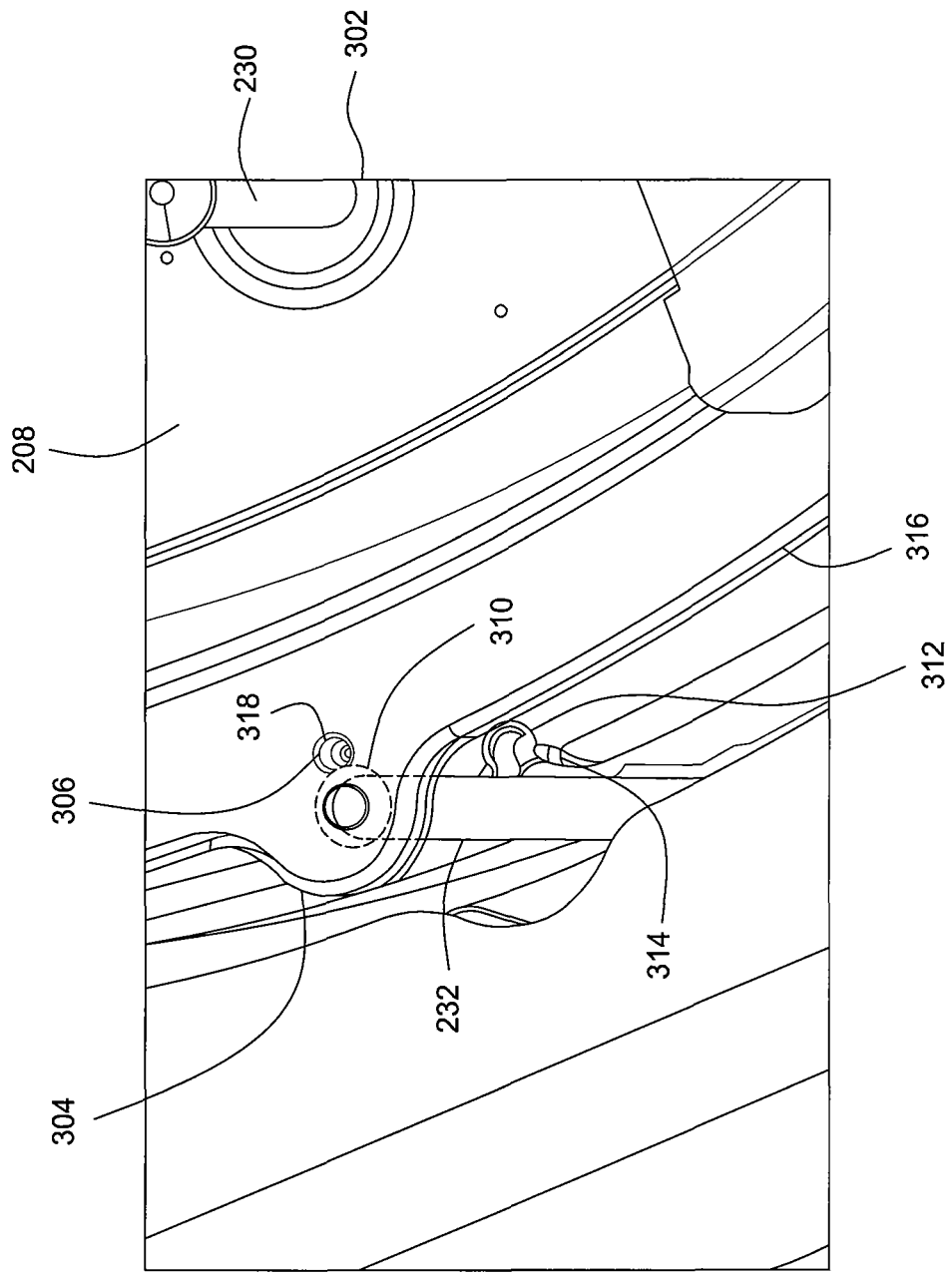
FIG. 3B depicts a detail view of a portion of the apparatus depicted in FIG. 3A, according to another embodiment described herein.

FIG. 3B is a detail view of a portion of the apparatus illustrated in FIG. 3A. A section of the energy blocker 300 is shown, in which the lift pin tab 304 and alignment point 306 are visible. Also visible is the substrate support 208 and opening 302 therein, with lift pin 230 shown in its extended position. Lift pin 232 is also shown in its extended position, mating with tab 304. In this embodiment, lift pin 232 mates with tab 304 by virtue of recess 310. In this embodiment, the lift pins and recesses have a circular cross-sectional shape, but in other embodiments they may have any shape, such as square, rectangular, triangular, oval, and the like. Additionally, although the embodiment of the apparatus depicted in FIG. 3A features three tabs for three lift pins, any convenient number of lift pins may be used, so long as an energy blocker can be adequately manipulated. In this embodiment, alignment point 306 is a tapered pin projecting downward from energy blocker 300 and mating with notch 312. From the top of energy blocker 300, alignment point 306 appears as a recess in the upper surface of energy blocker 300. Any arrangement and number of alignment points 306 designed to ensure alignment of energy blocker 300 with substrate support 208 may be used. For example, alignment pins may be disposed on substrate support 208 pointing upward into recesses formed in energy blocker 300. Alignment of energy blocker 300 with substrate support 208 ensures that the desired portions of a substrate disposed on substrate support 208 are shielded from electromagnetic radiation.

Figure 3C:
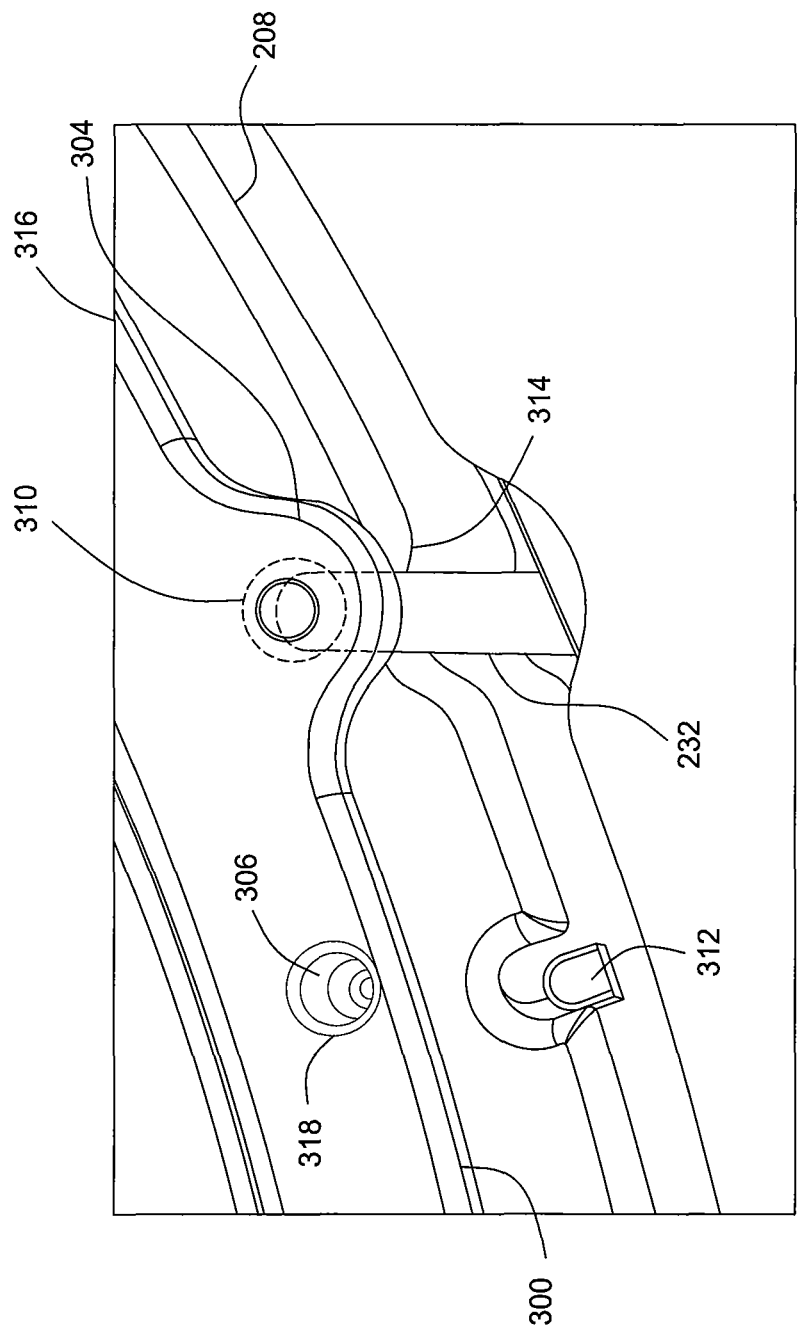
FIG. 3C depicts a detail view of another portion of the apparatus depicted in FIG. 3A, according to another embodiment described herein.

In the embodiment illustrated by FIG. 3B, notch 312 is aligned with indentation 314 to allow lift pin 232 to travel freely past substrate support 208 and engage with recess 310 in tab 304. FIG. 3C shows an alternate embodiment in which alignment point 306 is displaced from indentation 314. In both embodiments illustrated by FIGS. 3B-3C, energy blocker 300 has a rounded or beveled edge 316. Alignment point 306 also has a rounded or beveled edge 318 on the upper surface of energy blocker 300. In these two embodiments, edge 318 of alignment point 306 is shown substantially tangent to the inner extremity of rounded or beveled edge 316 of energy blocker 300. Alternate embodiments may, however, include alignment features located at any convenient point. For the two illustrated embodiments, alignment points 306 may be located a distance approximately halfway between the inner and outer edge of energy blocker 300, or substantially tangent to the inner edge.

Figure 4A:
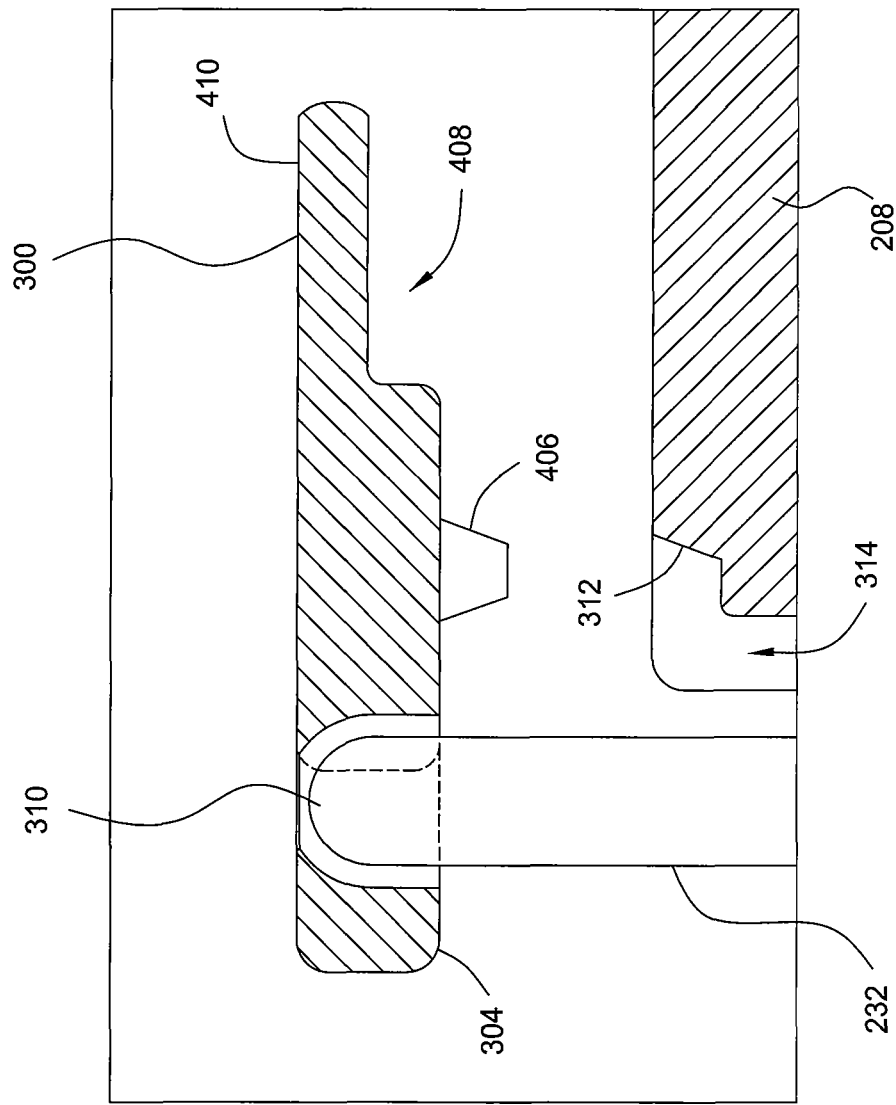
FIG. 4A depicts a cross-section view of a processing apparatus according to another embodiment described herein.

FIG. 4A depicts a cross-section view of energy blocker 300 shown in a spaced-apart configuration relative to substrate support 208, as described in one embodiment. Lift pin 232 is visible mating with recess 310 in tab 304, as described above. Alignment point 306 is illustrated as a frustroconical pin 406 projecting downward from energy blocker 300 for mating with notch 312, with no corresponding recess in the upper surface of energy blocker 300.

Figure 4B:
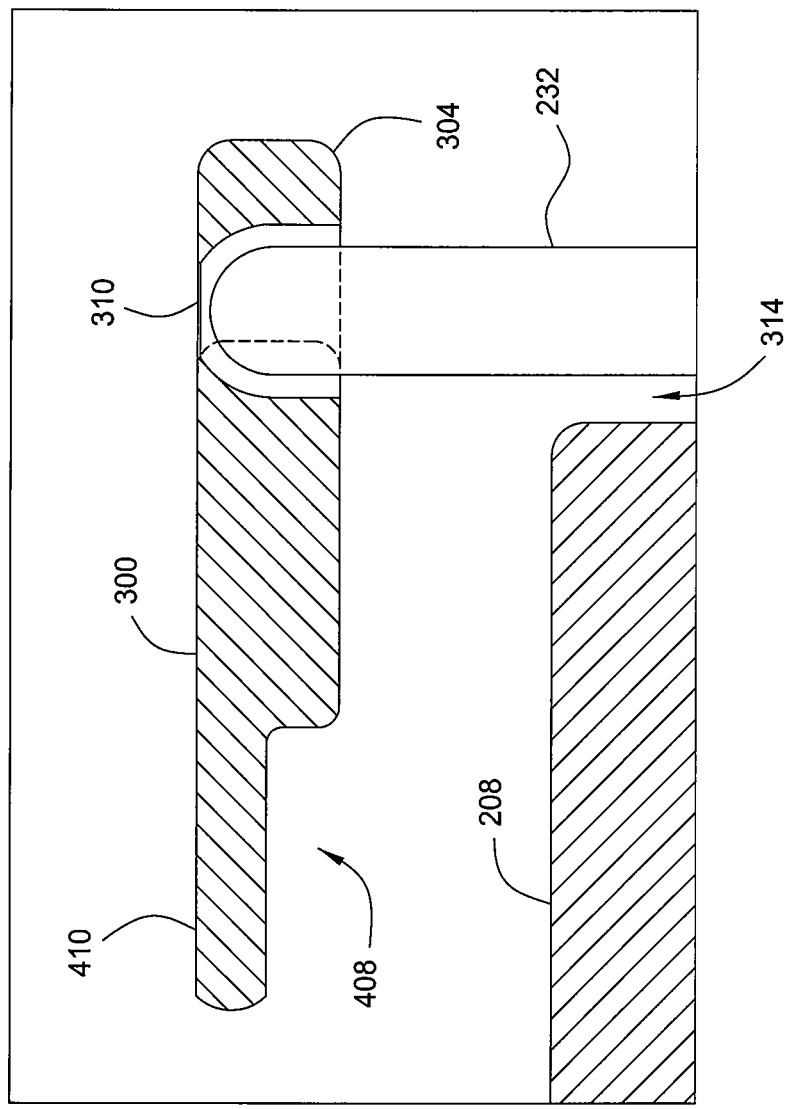
FIG. 4B depicts another cross-section view of a processing apparatus according to one embodiment described herein.

In operation, the energy blocker of this embodiment is configured to rest on substrate support 208 during processing. Energy blocker 300 features indentation 408 designed to remain spaced apart from substrate support 208 when energy blocker 300 rests on substrate support 208. Indentation 408 is sized such that extension 410 extends over a portion of a substrate disposed on substrate support 208 during processing. Extension 410 thus creates a shadow over a portion of a substrate resting on substrate support 208, preventing electromagnetic energy (e.g., laser light) from impinging the substrate too close to the substrate edge. In this way, energy blocker 300 with extension 410 protects the edge of a substrate disposed on substrate support 208 from deformation or damage due to extreme thermal stresses during processing. Energy blocker 300 is thus sometimes referred to as a shadow ring or an edge ring. FIG. 4B illustrates an alternate embodiment, wherein notch 312 is misaligned or not aligned with indentation 314.

Energy blocker 300, depicted in FIG. 4A, may have a thickness of up to about 5 millimeters (mm) at a thickest point. Indentation 408 may reduce thickness by up to about 80%, resulting in thickness of extension 410 less than about 3 mm. Extension 410 may create a shadow on the substrate up to about 3 mm from an edge of the substrate. Clearance between extension portion 410 and a substrate resting on substrate support 208 may be less than about 2 mm during processing.

Energy blocker 300 may contain or be made of quartz, doped quartz, silicon oxide, silicon dioxide, silica, silicon carbide, aluminum oxide, alumina, aluminum nitride, hafnium oxide, tantalum oxide, titanium oxide, sapphire, silicates thereof, derivatives thereof, dopant variants thereof, or combinations thereof. In many embodiments, energy blocker 300 contains quartz or a quartz-containing material that is coated by thin layers of dielectric materials, such as a dielectric mirror, a dielectric film stack, or another type of optical coating. The thin layers of dielectric materials may contain magnesium fluoride, silicon oxide, silicon dioxide, tantalum oxide, tantalum pentoxide, zinc sulfide, titanium oxide, titanium dioxide, magnesium oxide, hafnium oxide, aluminum oxide, sapphire, silicates thereof, derivatives thereof, dopant variants thereof, or combinations thereof.

In some embodiments, energy blocker 300 is a shadow ring or an edge ring and contains quartz that has a dielectric mirror as an optical coating. The dielectric mirror contains multiple layers of metal oxides. Energy blocker 300 may be selectively opaque to the initial light or laser beam radiated from a light source (e.g., laser source), where the initial light or laser beam may have a wavelength within a range from about 750 nm to about 875 nm, preferably, from about 780 nm to about 830 nm, and more preferably, from about 800 nm to about 815 nm, and more preferably, from about 806 nm to about 812 nm, and more preferably, from about 808 nm to about 810 nm, such as about 809 nm. Energy blocker 300 may further be transparent the emitted light from the surface of the substrate while being be selectively opaque to the initial light or laser beam radiated from the light source. Energy blocker 300 may be transparent to the emitted light having a wavelength of less than 800 nm or greater than 815 nm, preferably, less than 775 nm or greater than 850 nm, and more preferably, less than 750 nm or greater than 875 nm. In some examples, the energy blocker 300 may be transparent to light having a wavelength of less than 800 nm or at about 810 nm or greater, such as about 815 nm or greater, preferably, about 900 nm or greater, more preferably, about 1,000 nm or greater, more preferably, about 1,100 nm or greater, and more preferably, about 1,200 nm.

In alternative embodiments, energy blocker 300 may contain alumina or derivatives thereof and the alumina may have a chemical formula of $Al_xO_y$, wherein the ratio of y/x is within a range from about 1.3 to about 1.7. In some embodiments, energy blocker 300 may be opaque or transmits some or all light, or other electromagnetic energy, incident thereon. In one example, energy blocker 300 contains 99.5% alumina. In another example, energy blocker 300 contains doped silica.

Figure 5:
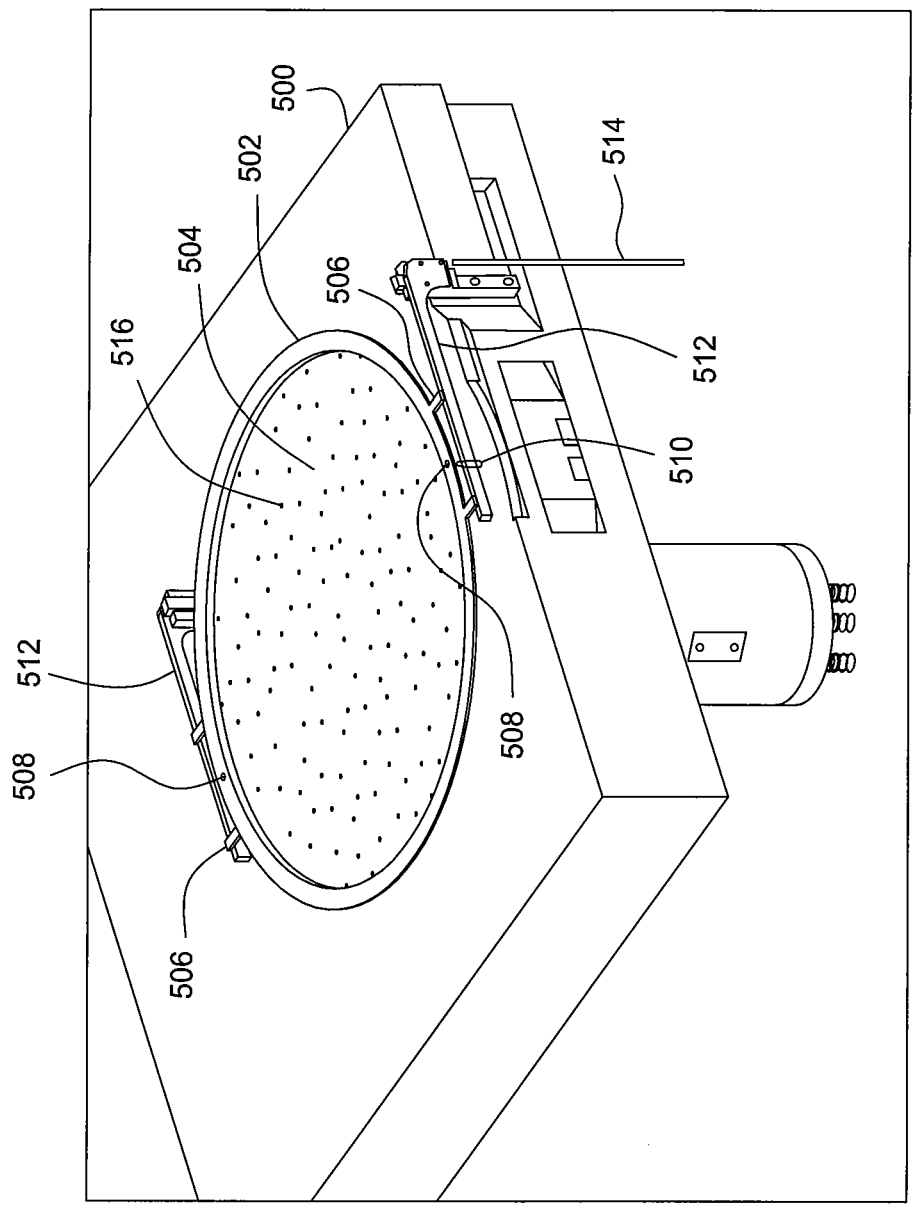
FIG. 5 depicts a perspective view of a processing apparatus according to another embodiment described herein.

FIG. 5 illustrates an alternative embodiment of the invention. A lower portion 500 of a processing chamber is visible. An energy blocker 502 is shown disposed above a substrate support surface 504. Substrate support surface 504 features holes 516 for delivering processing media to portions of a substrate disposed on support surface 504. Energy blocker 502 features a plurality of tabs 506 extending from an outer edge of energy blocker 502. In this embodiment, energy blocker 502 is a ring, annular in shape and formed as a single article, configured to block light or other electromagnetic energy from reaching at least a portion of a substrate disposed on support surface 504. Energy blocker 502 may be a shadow ring or an edge ring. Energy blocker 502 also features a plurality of alignment points 508, configured as holes in energy blocker 502 for mating with pins 510 disposed on chamber lower portion 500. In this embodiment, energy blocker 502 is manipulated by lift arms 512, which extend beneath the plurality of tabs 506. Lift arms 512 are actuated by lift pins 514, which move lift arms 512 in a vertical direction, enabling lift arms 512 to contact tabs 506 and lift energy blocker 502 thereby. In this embodiment, energy blocker 502 may contain any material capable of blocking the desired energy and withstanding process conditions. Some preferable materials are discussed above. Energy blocker 502 may be opaque or may transmit some or all electromagnetic energy incident thereon.

Other embodiments of the invention are contemplated, although not illustrated in the figures. An annular energy blocker such as those described above may be formed from two or more detachable parts, which may be coupled and uncoupled at convenient times during processing cycles. For example, two or more ring parts may be coupled to form a radiation blocker for a processing chamber. During processing, the ring parts may rest on a substrate support to block electromagnetic energy from reaching at least a portion of a substrate disposed on the support. When a substrate is inserted or withdrawn from the processing chamber, the ring parts may retract vertically or laterally to allow access to the substrate. For example, three ring parts may each be coupled to a retractor designed to move each ring part a set distance laterally to allow clearance for a substrate to be lifted above the substrate support.

Figure 6:
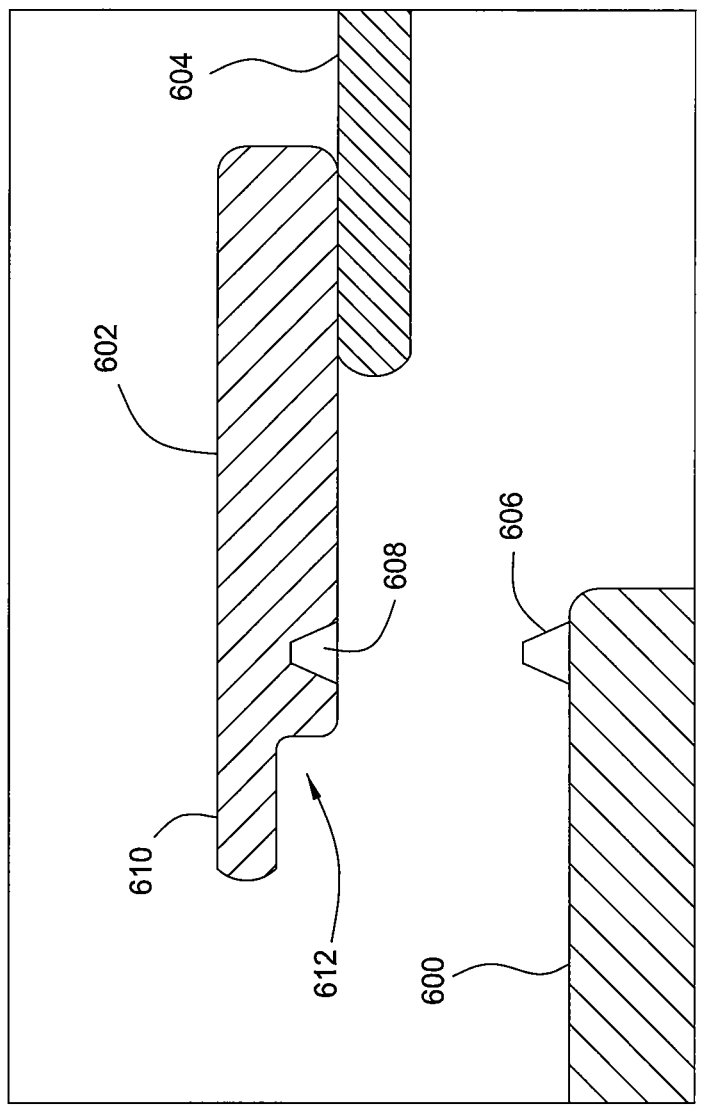
FIG. 6 depicts a cross-section view of a processing apparatus according to another embodiment described herein.

FIG. 6 illustrates another embodiment of the invention. A substrate support 600 is visible, with an energy blocker 602. A support ring 604 is provided in this embodiment for restraining energy blocker 602 when it is not in contact with substrate support 600. When the two are in contact, energy blocker 602 rests on substrate support 600. Alignment is achieved by virtue of pins 606 on substrate support 600, which are configured to mate with recesses 608 in energy blocker 602. In this embodiment, pins 606 are shown as frustroconical extensions protruding from substrate support 600, and configured to insert into recesses 608 with similar shape. In alternate embodiments, however, pins 606 and recesses 608 may have any convenient shape, such as rounded, square, triangular, and the like.

In operation, the apparatus depicted in FIG. 6 functions to passively dispose energy blocker 602 on substrate support 600 during processing. Substrate support 600 is generally movable in this embodiment, raising and lowering inside the processing chamber to facilitate insertion and withdrawal of substrates. Substrate support 600 containing a substrate disposed thereon raises into a processing position. As substrate support 600 rises, pins 606 contact and mate with recesses 608, lifting energy blocker 602 from support ring 604. Extension 610 of energy blocker 602 extends above a portion of the substrate disposed on support 600 by virtue of indentation 612, and blocks a portion of electromagnetic energy being directed toward the substrate. In some embodiments, energy blocker 602 may be a shadow ring or an edge ring. After processing, substrate support 600 lowers into a substrate transfer position. Energy blocker 602 rests on support ring 604 and disengages from support 600, creating space for withdrawal of the substrate.

Energy blockers as described herein may also be useful as a method of shielding measurement devices from unwanted radiation inside a processing chamber. Devices are commonly deployed inside a processing chamber to measure various parameters during processing. In many cases, these devices are sensitive to electromagnetic radiation, and may suffer inaccuracy or damage from energy directly incident from the energy source. An energy blocker as described herein may be used to prevent energy from the source from directly impinging measurement devices. For example, in some embodiments, temperature measurement devices, such as pyrometers, may be disposed inside a processing chamber for measuring the temperature of a substrate by sensing electromagnetic energy radiated by the substrate. Such instruments would be inaccurate if energy directly from the source were to impinge on them. A radiation blocker such as that described herein may block at least a portion of electromagnetic energy that might otherwise impinge directly on the device.

Figure 7A:
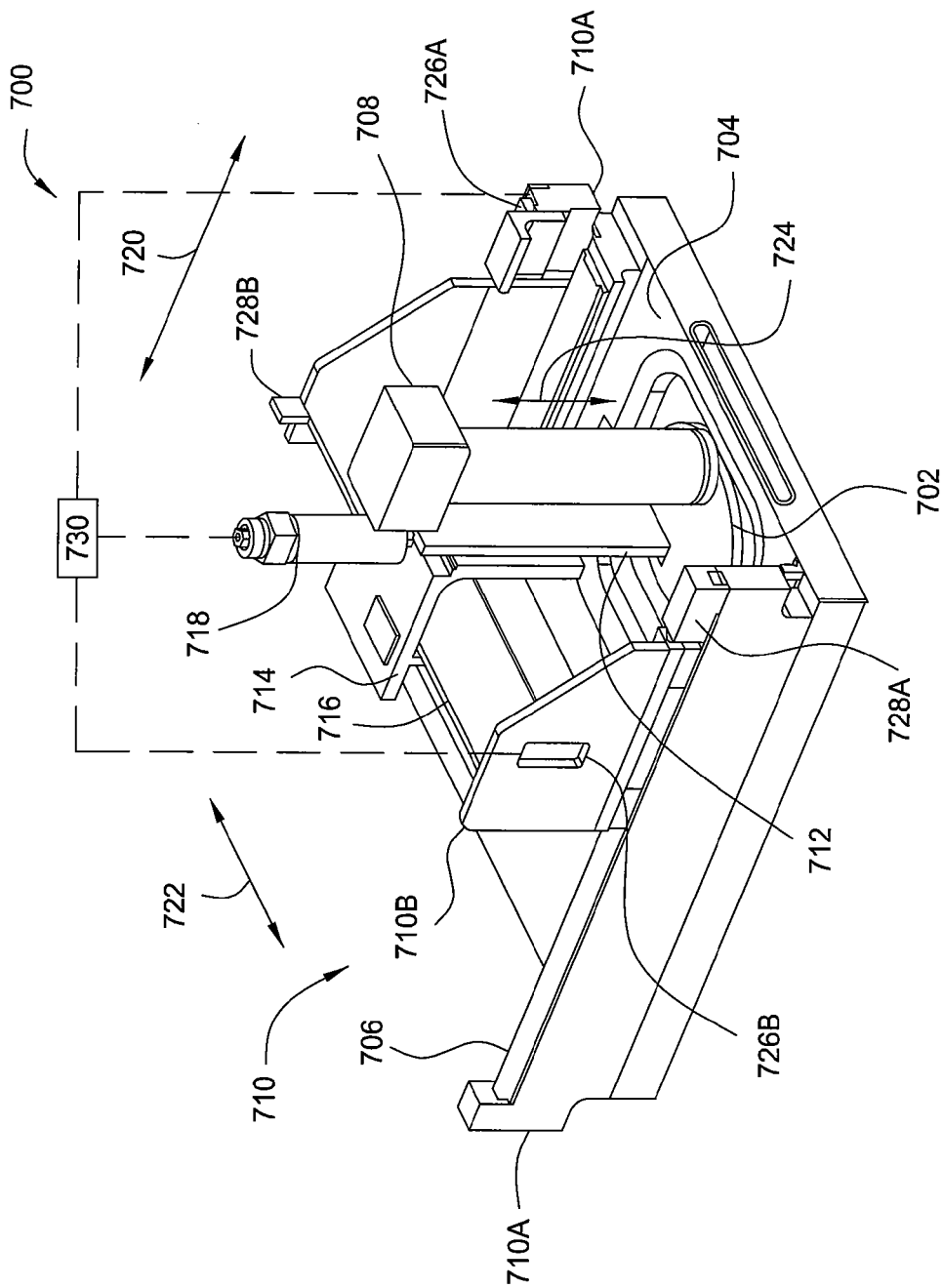
FIG. 7A depicts an isometric view of a processing apparatus according to one embodiment described herein.

Embodiments of the invention provide an apparatus for processing a substrate which contains a substrate support disposed within a work surface, a rail assembly over the substrate support, and an optical assembly coupled to the rail assembly. FIG. 7A illustrates an isometric view of processing apparatus 700 according to one embodiment of the invention. Processing apparatus 700 has a substrate support 702 disposed on a base 701 and in a process region below a work surface 704. A rail assembly 706 is disposed on or over the work surface 704 and an optical assembly 708 may be coupled with the rail assembly 706. The substrate support 702 holds a substrate (not shown) in position to facilitate exposure to energy from an energy source disposed in the optical assembly. The rail assembly 706 is adapted to allow movement of the optical assembly 708 over the substrate so that all parts of the desired substrate surface may be irradiated.

In some embodiments, the optical assembly 708 may contain a heater (e.g., a heating element or a laser) for heating the surface of a substrate. The heater may be a laser in some embodiments, and may be positioned or suspended over and directed towards the substrate. In some embodiments, the energy directed towards the substrate surface travels in a direction substantially perpendicular to a plane extending across the substrate surface. A laser may be configured to emit coherent light at a wavelength selected to impart thermal energy to the substrate. In embodiments adapted for heating semiconductor substrates, such as silicon-containing substrates, the laser may be adapted to emit radiation (e.g., light beam) at a wavelength of less than about 800 nm. The laser may emit radiation in the infrared spectrum, the visible spectrum, the ultraviolet spectrum, and the x-ray spectrum.

A substrate heated by exposure to the energy emitted by the optical assembly 708 emits radiation as the temperature increases. Some embodiments provide at least one sensor (not shown) to measure the radiation emitted by the substrate, and to determine the temperature of the substrate surface from the emitted radiation. The sensor, which may be a thermal sensor in some embodiments or a pyrometer in other embodiments, is preferably configured to collect radiation emitted from the treatment region irradiated by the laser. In some embodiments, the sensor may be co-located with the laser in the optical assembly 708 so that the sensor can track movements of the laser exactly. In some embodiments, the function of the sensor may be enhanced by preventing all radiation not originating from the irradiated treatment region from reaching the sensor, such as, by utilizing a filter or the like.

Embodiments of the invention provide a rail assembly 706 upon which the optical assembly 708 may be mounted thereto. The rail assembly 706 may be utilized to precisely locate the laser over desired portions of the substrate. Rail assembly 706 contains a plurality of members or rails movably coupled together, upon which the optical assembly 708 may be mounted, and which are adapted to provide translation of the optical assembly generally in a plane parallel to the plane described by the surface of the substrate. A first portion of the plurality of movably coupled members provides controlled motion in a first direction generally parallel to the surface of the substrate, and a second portion of the plurality of movably coupled members provides motion in a second direction generally parallel to the surface of the substrate and generally perpendicular to the first direction.

In some embodiments, the first portion of the plurality of movably coupled members contains two lower rails 710A and the second portion of the plurality of movably coupled members contains an upper rail 710B coupled to the lower rails 710A. The upper rail 710B is adapted to move along the lower rails 710A in the first direction. The two lower rails 710A are preferably mounted upon opposite sides of the work surface 704 of the processing apparatus 700, and the upper rail 710B mounted on the two lower rails 710A perpendicular to both the lower rails 710A.

The optical assembly 708 is generally coupled to the upper rail 710B in a way that enables the optical assembly to translate along the upper rail 710B in the second direction. The optical assembly 708 may be mounted on a mounting bracket 712 that engages the upper rail 710B by a flange 714 that mates with a guide 716 formed in the upper rail 710B. In alternate embodiments, the mounting bracket 712 may engage the upper rail 710B by a plurality of pins or tabs (not shown) that engage with the guide 716. In one exemplary embodiment, the upper rail moves along the two lower rails in an x-direction denoted by arrow 720, while the optical assembly moves along the upper rail in a y-direction, denoted by arrow 722, perpendicular to the x-direction.

In some embodiments, a third mode of translation is accomplished through use of an elevator 718 configured to translate the optical assembly 708 in a third direction perpendicular or substantially perpendicular to the work surface 704 (or an extending plane across the work surface 704) and to the first two directions. The elevator 718 may translate the optical assembly 708 in the z-direction, denoted by arrow 724. The optical assembly 708 may be coupled with the elevator 718, and the elevator 718 may in turn be coupled with the upper rail 710B by attaching it to the mounting bracket 712 or through a direct coupling without a mounting bracket.

In alternate embodiments, the upper rail 710B may engage the work surface 704 directly, without the use of lower rails for support. In some embodiments, the upper rail 710B may engage the work surface 704 by operation of one or more guides, grooves, or recesses (not shown) formed in the work surface 704. In some embodiments members may extend downward from the edges of the upper rail 710B to engage the work surface 704. The downward extensions may mate with a groove, which provides a track for controlling movement of the optical assembly 708 in the first direction.

Other alternate embodiments may feature an optical assembly such as the optical assembly 708 coupled to a positioning apparatus. The positioning apparatus may rest on the work surface 704 or may engage the work surface 704 through a translation coupling. In one alternate embodiment, the positioning apparatus may be a robot arm attached to the work surface and configured to swivel and extend to position the optical assembly at a desired position over the work surface. In another alternate embodiment, the positioning apparatus may be a robot arm mounted on a translation mechanism coupled to the work surface, the translation mechanism being adapted to translate the robot arm and optical assembly in a first direction, and the robot arm being adapted to extend in a second direction substantially perpendicular to the first direction. Each alternate embodiment may also feature an elevator for translating the optical assembly in a third direction substantially perpendicular to the first two directions, and substantially perpendicular to a plane extending across the work surface.

To minimize disruption during operation of the processing apparatus 700, movement of the upper rail 710B along the lower rails 710A and the optical assembly 708 along the upper rail 710B is preferably frictionless or substantially frictionless. Embodiments of the invention provide one or more actuators coupled to the plurality of members 710. In the embodiment depicted in FIG. 7A, a first actuator 726A is coupled to the lower rails 710A, and a second actuator 726B is coupled to the upper rail. The first actuator 726A is generally adapted to position the upper rail 710B at a desired location along the length of the lower rails 710A. The second actuator 726B is generally similarly adapted to position the optical assembly at a desired location along the upper rail 710B. The actuators 726A and 726B may be located in any convenient place to enable them to energize the positioning mechanism.

Figure 7B:
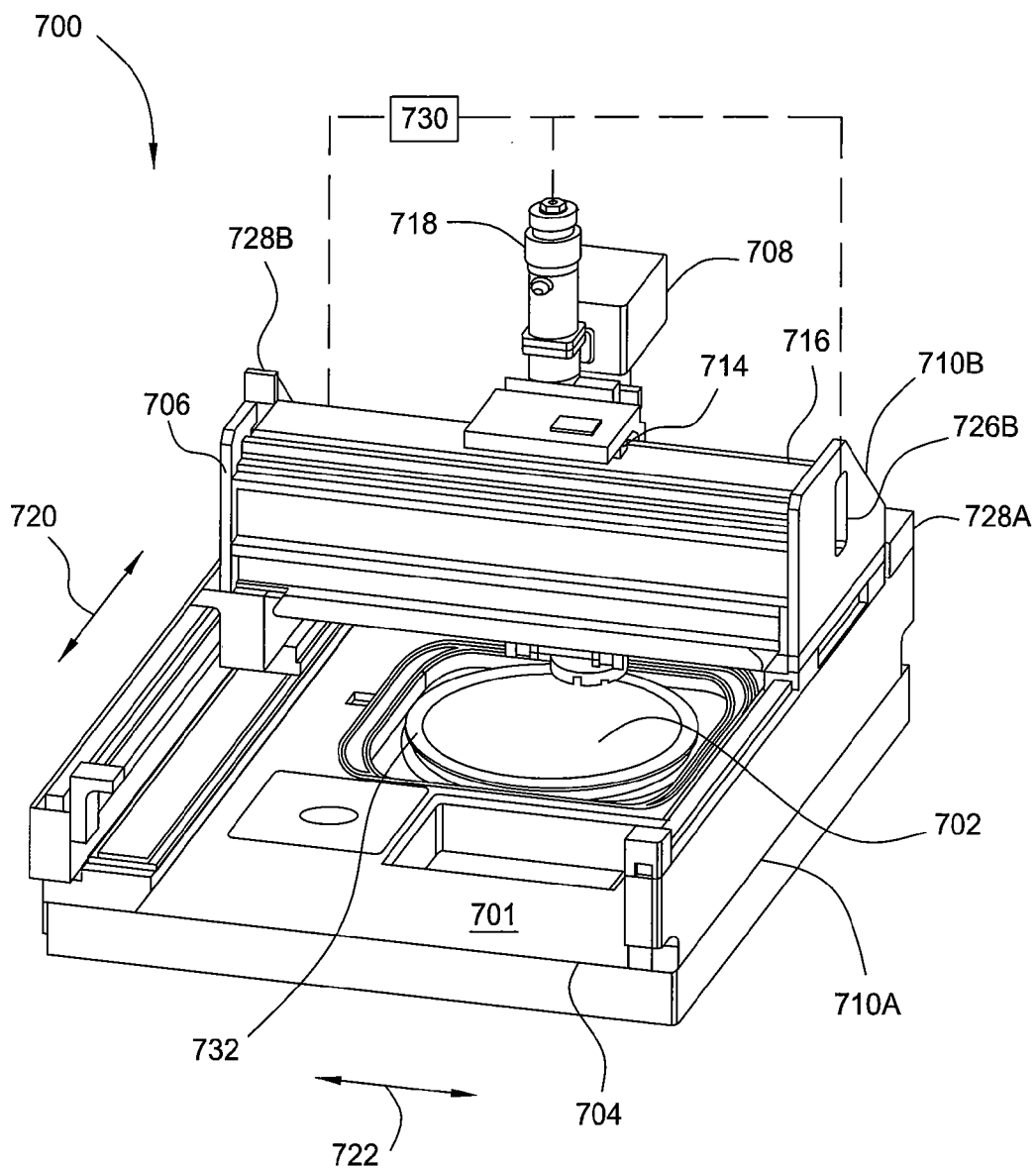
FIG. 7B depicts a back view of the apparatus depicted in FIG. 7A.

FIG. 7B depicts a back view of the processing apparatus 700. A controller 730 may be provided in some embodiments to coordinate and control movement and operation of the processing apparatus 700. The processing apparatus 700 contains the controller 730 coupled to the actuators 726A and 726B and to the elevator 718. The controller 730 registers the position of the optical assembly 708 in local coordinates and signals the actuators to move the optical assembly 708 as needed. The controller 730 may be a programmed computer, or may be under the control of a programmed computer.

In some embodiments, frictionless motion or substantially frictionless motion may be achieved in various manners. In one embodiment, substantially frictionless movement may be accomplished by use of rollers or bearings. In the embodiment depicted in FIG. 7A, for example, the upper rail 710B may be mounted on the lower rails 710A by rollers or precision bearings, and the mounting bracket 712 may likewise contain rollers or bearings that engage the upper rail 710B. In embodiments featuring a roller or bearing suspension, actuators 726A and 726B may be used to impel frame members, such as rail assembly 706 to desired locations. In some examples, actuators 726A and 726B may contain motors or magnetic drives. In another embodiment, magnetic drives may be further configured to generate a repulsive magnetic force to maintain a gap between frame or rail assembly members for frictionless motion or substantially frictionless motion.

In one embodiment, sensors are coupled to the rail assembly 706 to indicate a fixed position. Referring again to FIG. 7A, a sensor 728A may be coupled with a lower rail 710A and a sensor 728B may be coupled with upper rail 710B. The sensors 728A and 728B provide a fixed point of reference from which to determine position of the optical assembly 708 in the coordinates of rail assembly 706. Therefore, the exact position of the optical assembly may be determined relative to a substrate disposed on the work surface.

Referring to FIG. 7B, the sensors also allow exact comparison of the position of the optical assembly 708 with that of an energy blocker 732, such as that described elsewhere herein, disposed over the substrate support 702. Precise positioning of the optical assembly 708 with respect to the energy blocker 732 allows computation of a fraction of the energy from the optical assembly falling on a substrate disposed on the substrate support 702, as is further described below. The sensors 728A and 728B may be magnetic sensors that detect a current change with proximity, or sensors 728A and 728B may be pressure switches of a mechanical or piezoelectric variety. The sensors 728A and 728B provide a zero position in the first and second directions, enabling the determination of an origin point for a machine frame of reference.

In some embodiments, a height sensor (not shown) may be provided and may be located with the optical assembly 708, or may be co-located with the energy source inside the optical assembly 708. The height sensor is preferably oriented to direct energy toward the work surface, and to detect reflected energy to compute the distance to the reflective surface. In some embodiments, the height sensor may be a range finder. In other embodiments, the height sensor may be an acoustic locator. In still other embodiments, the height sensor may be an infrared locator. The height sensor may be useful for detecting the edge of the energy blocker 732. Detecting the edge of the energy blocker 732 provides an alternate way to determine a fraction of energy from the energy source in the optical assembly 708 falling on a substrate disposed on the substrate support 702.

In some embodiments, the detector or thermal sensor used to detect radiation emitted by the substrate surface may also be used to detect the position of an edge member. If the energy used to heat the substrate surface is focused to achieve maximum efficiency of heating, and if the edge member has an upper surface that is elevated with respect to the substrate surface, the energy striking the edge member may be unfocused, and the edge member is not be heated. The detector or thermal sensor may be used to detect a reduction in emitted radiation that may be used to locate the position of the edge member.

In some embodiments, the various energies may be filtered prior to treating a substrate. For example, an edge member may selectively block energy of the type used to heat the substrate surface while admitting energy emitted by the heated substrate. In other examples, a detector or thermal sensor tuned to the type of energy emitted by the heated substrate may be utilized to detect heating under the energy blocker. In some embodiments, energy received by the various sensors may be filtered to screen out energy types not intended to be detected by each sensor. For example, a filter that admits only energy emitted by the substrate may be applied to the temperature sensor for preventing energy not emitted by the treatment region from reaching the sensor. In another example, energy reflected from the substrate or work surface may be reflected to facilitate the operation of an optical height sensor, range finder, or locator.

Figure 8A:
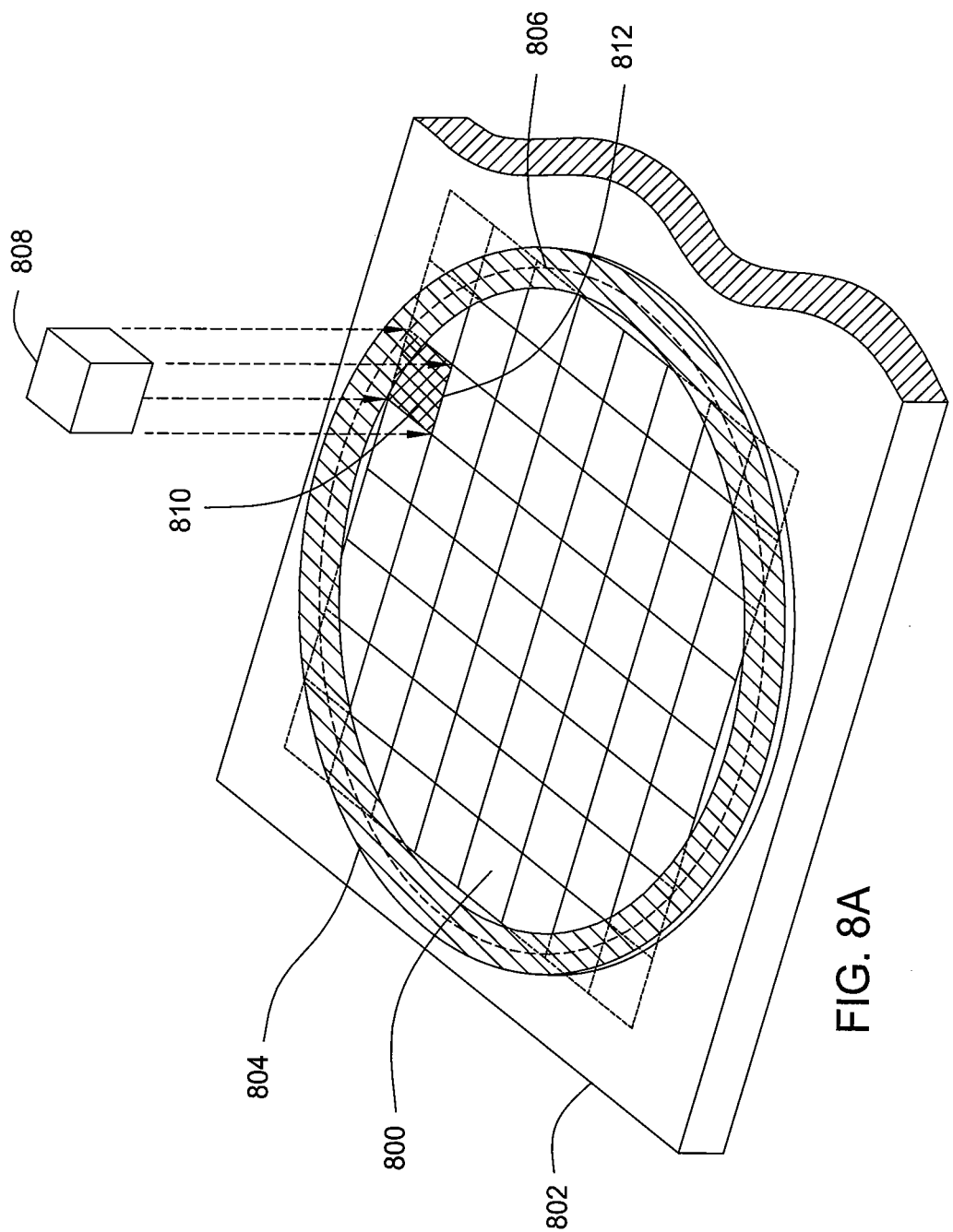
FIG. 8A depicts a schematic view of a thermal processing apparatus performing a thermal treatment method according to one embodiment described herein.

Using an energy blocker in an apparatus as described herein motivates a method of measuring the temperature of a substrate disposed in the apparatus. FIG. 8A depicts a schematic view of a thermal processing apparatus performing a thermal treatment method according to one embodiment of the invention. A substrate 800 is disposed on a substrate support 802. An edge member 804 is disposed over an edge portion 806 of the substrate 800. The edge member 804 may be an energy blocker as described above. A detector 808, such as a thermal sensor, may be used to detect electromagnetic radiation being emitted from an emitting region 810. A portion of the emitting region 810 includes the substrate surface 812, while a portion includes the edge member 804. The radiation emitted from the emitting region 810 is the sum of radiation emitted from the substrate surface 812 and radiation emitted from the edge member 804. The detector 808 may be used to measure the temperature of the substrate surface.

Figure 8B:
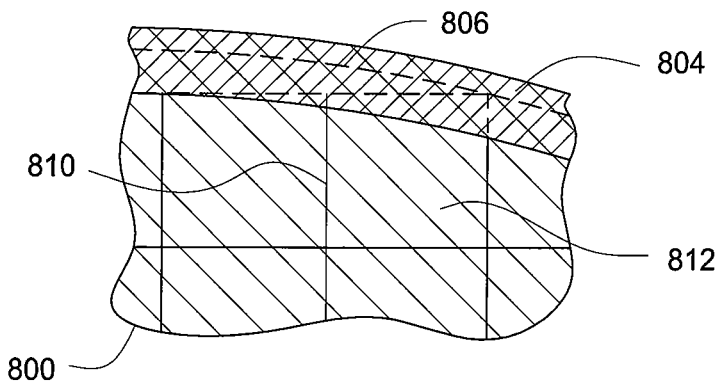
FIG. 8B depicts a close-up view of the apparatus depicted in FIG. 8A according to one embodiment described herein.

FIG. 8B depicts a close-up view of the device illustrated in FIG. 8A. The substrate 800 is partially obscured by the edge member 804, such that a portion of the emitting region 810 is at the substrate surface 812, and another portion is at by the edge member 804. In many embodiments, the edge member 804 may have a different emissivity, and may contain or be made from a different material, as the substrate surface 812.

In an embodiment featuring an edge member as described in connection with FIGS. 2A-6, the upper surface of the edge member may be elevated above the upper surface of a substrate disposed on the substrate support. When laser light is used to heat the upper surface of the substrate, any laser light falling on the edge member may be out of focus, so the edge member may absorb little or no heat from the laser. Other embodiments may, however, heat the edge member such that it emits radiation. If the edge member 804 has a higher emissivity than the substrate surface 812, the detector or thermal sensor may be used to measure a temperature that is too high. If the detector or thermal sensor is used in a method of annealing a substrate or a method of detecting an endpoint during a thermal treatment process that heats the edge member, the endpoint may be reached too soon, and annealing discontinued before the desired results have been obtained. If the converse is true, then the substrate may be damaged.

Figure 9:
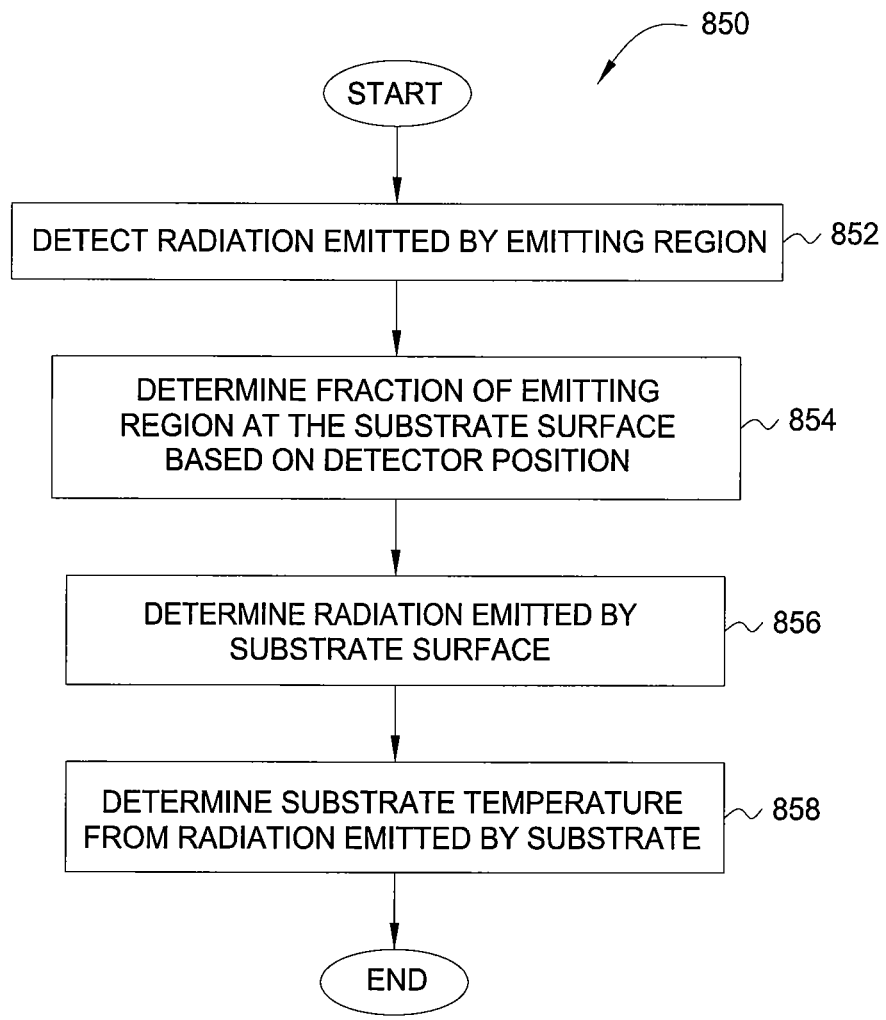
FIG. 9 depicts a flow chart describing a method which may be used with various processing apparatuses according to one embodiment described herein.

FIG. 9 illustrates a flow chart describing process 850 which may be used with the processing apparatus 700 and detector 808 (e.g., thermal sensor) depicted in FIGS. 7A-8B, according to one embodiment described herein. At step 852, the detector 808 or thermal sensor, which may be located in an optical assembly such as the optical assembly 708 depicted in FIG. 7A, detects radiation emitted by the emitting region. The detector 808 or thermal sensor may be a pyrometer in some embodiments.

As shown in FIG. 8B, the emitting region contains at least a portion of the substrate surface, and may also contain a portion of the edge member 804. The portion of the emitted radiation attributable to the substrate surface 812 may be determined by defining a surface metric from the edge member 804 extending over the substrate surface 812. If the edge member 804 is an energy blocker as described above, the location of the edge member 804 is determined to a high degree of accuracy. If the detector 808 is coupled to an apparatus with precision location capability, such as the apparatus depicted in FIGS. 7A-7B, the location of the detector or thermal sensor may also be known to a high degree of accuracy. Comparing the position of the detector 808, which may be used to determine the dimensions of the emitting region 810, with the location of the edge member 804 allows the portion of the substrate surface 812 in the emitting region 810 to be registered by the area of the substrate surface 812 in the emitting region 810 and the area of the edge member 804 in the emitting region 810. Thus a fraction of the emitting region 810 at the substrate surface 812 may be determined at step 854. For embodiments featuring an edge member with an elevated upper surface, and thermal treatment by laser light, zero emission from the edge member may be assumed, and the radiation emitted by the substrate surface normalized by the fraction of the emitting region at the substrate surface at step 856. The substrate temperature may then be determined at step 858.

In embodiments wherein the edge member is heated to some extent, the substrate temperature may be determined from the relative emissivity of the substrate material and the edge member material. Comparison of a standard emissivity for the edge member 804 with a standard emissivity of the substrate surface 812 allows determination of the portion of the emitted electromagnetic radiation attributable to the substrate surface 812. From this, the radiation emitted by the substrate surface may be determined at step 856, and the temperature of the substrate surface 812 detected at step 858. Comparing the detected temperature to a target temperature allows detection of an end point for a thermal treatment or annealing process. In an annealing process featuring exposure of the substrate surface 812 to an incident electromagnetic radiation to accomplish heating, the incident radiation may be discontinued when the end point is reached.

Figure 10:
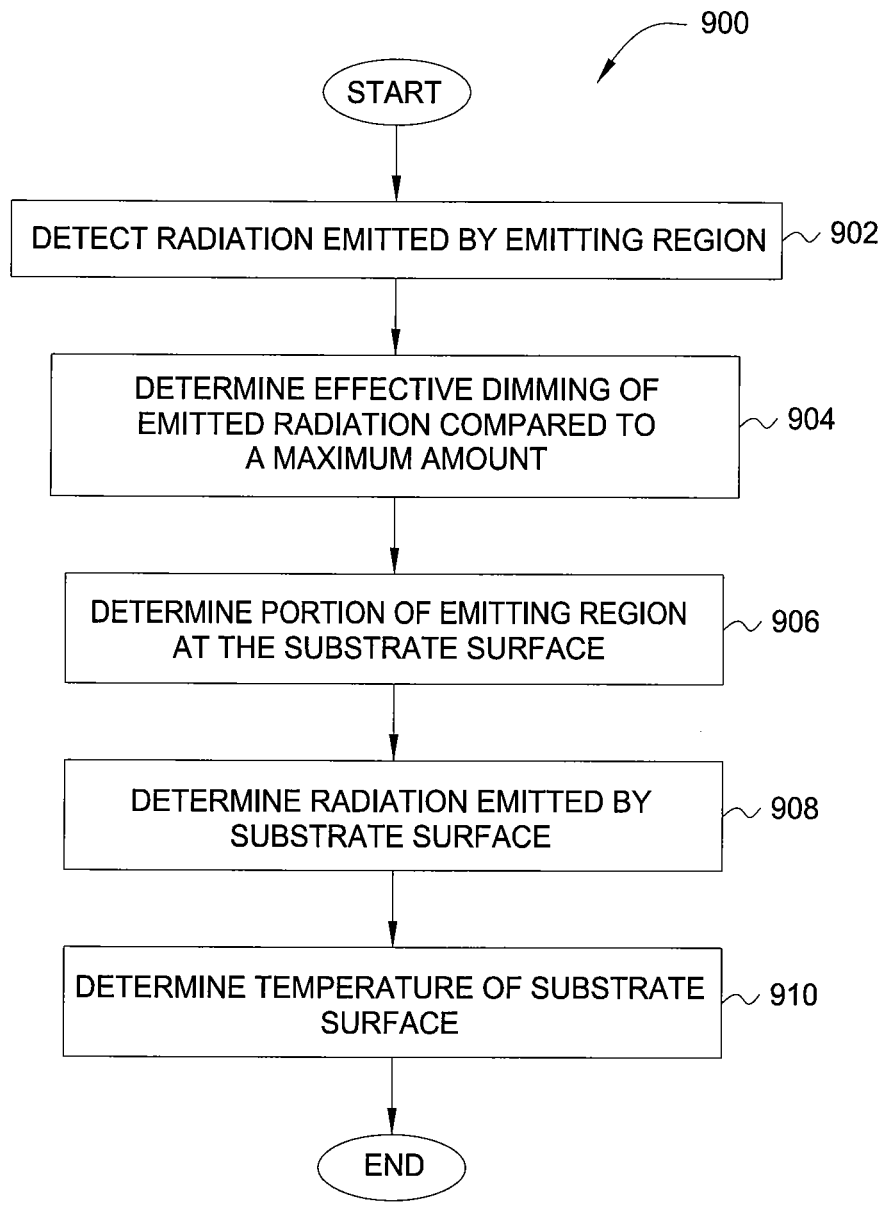
FIG. 10 depicts a flow chart describing another method which may be used with various processing apparatuses according to another embodiment described herein.

FIG. 10 depicts a flow chart illustrating process 900 which may be performed with the apparatus depicted in FIG. 7A, according to one embodiment described herein. As above, the process 900 utilizes elements described in connection with the illustrations depicted in FIGS. 7A-8B. At step 902, radiation emitted by an emitting region is detected by detector 808 or thermal sensor. The emitting region may have the same components described above in connection with the illustrations of FIG. 8B.

At step 904, an amount of effective dimming is determined by comparing the radiation detected with a maximum value of emittance. The maximum value of emittance may be stored from measurements of prior emitting regions at other locations on the substrate. In some embodiments, a minimum value of emittance may also be used as a basis of comparison. At step 906, a portion of the emitting region at the substrate surface is determined from the known location of the detector or thermal sensor and the known location of the edge member. A surface metric may be thus determined during step 906. The surface metric may then be used with the maximum value of emittance, and optionally the minimum value of emittance, to determine how much of the total emitted radiation is emitted by the substrate surface at step 908. From that, the temperature of the substrate surface may be determined at step 910 using the known emissivity of the substrate.

In another embodiment, a method for determining or measuring a temperature of a substrate surface is provided which includes radiating an initial light from a light source towards a surface of a substrate, heating the substrate by exposing the surface of the substrate to the initial light, radiating emitted light from a portion of the surface of the substrate, passing the emitted light through an energy blocker and towards a detector, such as a thermal sensor, and determining a temperature of the portion of the surface of the substrate from the emitted light with the thermal sensor.

The substrate may be disposed on a substrate support within a treatment region and then energy blocker may be disposed between the light source and the surface of the substrate. The light source may be a laser, a lamp, or another source of light. The detector or thermal sensor may be a pyrometer.

Embodiments provide that the energy blocker may be a shadow ring or an edge ring and is usually selectively opaque to the initial light and transparent to the emitted light. Therefore, the initial light may be reflected or absorbed by the energy blocker. The energy blocker, shadow ring, or edge ring, may contain or be made of quartz, doped quartz, silicon oxide, silicon dioxide, silica, silicon carbide, aluminum oxide, alumina, aluminum nitride, hafnium oxide, tantalum oxide, titanium oxide, sapphire, silicates thereof, derivatives thereof, dopant variants thereof, or combinations thereof. In many embodiments, the energy blocker contains quartz or a quartz-containing material and has an optical coating of multiple dielectric layers, such as a dielectric mirror or a dielectric film stack. The dielectric layers may be of the same composition of of different compositions. The optical coating of multiple dielectric layers may contain magnesium fluoride, silicon oxide, silicon dioxide, tantalum oxide, tantalum pentoxide, zinc sulfide, titanium oxide, titanium dioxide, magnesium oxide, hafnium oxide, aluminum oxide, sapphire, silicates thereof, derivatives thereof, dopant variants thereof, or combinations thereof.

In some embodiments, the energy blocker, shadow ring, or edge ring, contains quartz that has a dielectric mirror as an optical coating. The dielectric mirror contains multiple layers of metal oxides. The energy blocker, shadow ring, or edge ring may be selectively opaque to the initial light or laser beam radiated from a light source (e.g., laser source), where the initial light or laser beam may have a wavelength within a range from about 750 nm to about 875 nm, preferably, from about 780 nm to about 830 nm, and more preferably, from about 800 nm to about 815 nm, and more preferably, from about 806 nm to about 812 nm, and more preferably, from about 808 nm to about 810 nm, such as about 809 nm. The energy blocker, shadow ring, or edge ring may further be transparent the emitted light from the surface of the substrate while being be selectively opaque to the initial light or laser beam radiated from the light source. The energy blocker, shadow ring, or edge ring may be transparent to the emitted light having a wavelength of less than 800 nm or greater than 815 nm, preferably, less than 775 nm or greater than 850 nm, and more preferably, less than 750 nm or greater than 875 nm. In some examples, the energy blocker, shadow ring, or edge ring may be transparent to light having a wavelength of less than 800 nm or at about 810 nm or greater, such as about 815 nm or greater, preferably, about 900 nm or greater, more preferably, about 1,000 nm or greater, more preferably, about 1,100 nm or greater, and more preferably, about 1,200 nm.

In some examples, the initial light radiated from the light source may have a wavelength within a range from about 750 nm to about 875 nm, preferably, from about 780 nm to about 830 nm, and more preferably, from about 800 nm to about 815 nm, and more preferably, from about 806 nm to about 812 nm, and more preferably, from about 808 nm to about 810 nm, such as about 809 nm. The emitted light from the surface of the substrate may have a wavelength of less than 800 nm or greater than 815 nm, preferably, less than 775 nm or greater than 850 nm, and more preferably, less than 750 nm or greater than 875 nm.

In another embodiment, the method further provides detecting an edge of the energy blocker within the treatment region to determine the portion of the surface of the substrate. The portion of the surface of the substrate may be an interface between the perimeter edge of the substrate and a shadow cast by the shadow ring. In one example, the method provides detecting the edge of the energy blocker within the treatment region by utilizing a height sensor to detect a change in elevation within the treatment region. In some examples, the substrate support may be a moveable substrate support.

In another embodiment, a method for measuring or determining the temperature is provided which includes exposing the surface of the substrate to a laser beam radiating from a laser source, radiating emitted light from a portion of the surface of the substrate, through the shadow ring, and towards a detector, such as a thermal sensor, and determining the temperature of the portion of the surface of the substrate from the emitted light with the detector or thermal sensor. The substrate may be disposed on a substrate support within a treatment region and a shadow ring may be disposed between the laser source and the surface of the substrate. The shadow ring is usually opaque to the laser beam and transparent to the emitted light. In one example, the laser beam is reflected or absorbed by the shadow ring. The method further includes detecting an edge of the shadow ring within the treatment region to determine the portion of the surface of the substrate.

In another embodiment, a method for measuring a temperature of a substrate surface is provided which includes positioning a substrate on a substrate support and below a shadow ring, wherein the shadow ring is opaque to a first light and transparent to a second light, exposing an upper surface of the substrate to the first light radiating from a light source, emitting the second light from a portion of the surface of the substrate, through the shadow ring, and towards a detector, such as a thermal sensor, and determining a temperature of the portion of the surface of the substrate from the emitted light with the detector or thermal sensor. In one example, the first light or initial light is a laser beam radiated from a laser source or a lamp, and the second light is emitted light from the surface of the substrate.

In another embodiment, a processing apparatus for treating a substrate and measuring a surface temperature of the substrate is provided which includes a substrate support disposed within a processing body, a laser source positioned to direct a laser beam having a first wavelength towards the substrate support, an optical assembly containing a thermal sensor (e.g., pyrometer) configured to detect light at a second wavelength and coupled with the processing body, and an energy blocker disposed between the laser source and the substrate support and coupled with the processing body. The energy blocker may be a shadow ring or an edge ring and that is selectively opaque to the first wavelength while being transparent to the second wavelength. The first wavelength may be within a range from about 750 nm to about 875 nm and the second wavelength may be less than 800 nm or greater than 810 nm. In some example, the energy blocker contains quartz and has an optical coating of multiple dielectric layers.

While the foregoing is directed to embodiments of the invention, other and further embodiments of the invention may be devised without departing from the basic scope thereof, and the scope thereof is determined by the claims that follow.

The invention claimed is:

1. A method for measuring a temperature of a substrate surface, comprising:
 radiating an initial light from a light source towards a surface of a substrate, wherein the substrate is disposed on a substrate support within a treatment region and an energy blocker is disposed between the light source and the surface of the substrate, and the energy blocker is opaque to the initial light;
 heating the substrate by exposing the surface of the substrate to the initial light;
 radiating emitted light from the surface of the substrate;
 passing a portion of the emitted light through the energy blocker and towards a thermal sensor; and
 determining a temperature of the surface of the substrate below the energy blocker from the portion of the emitted light with the thermal sensor.

2. The method of claim 1, wherein the emitted light has a wavelength of less than 800 nm or greater than 815 nm.

3. The method of claim 2, wherein the emitted light has a wavelength of less than 750 nm or greater than 875 nm.

4. The method of claim 1, wherein the initial light has a wavelength within a range from about 750 nm to about 875 nm.

5. The method of claim 4, wherein the wavelength is within a range from about 800 nm to about 815 nm.

6. The method of claim 1, wherein the energy blocker is a shadow ring or an edge ring.

7. The method of claim 6, wherein the shadow ring or the edge ring comprises quartz and contains an optical coating of multiple dielectric layers.

8. The method of claim 6, wherein the portion of the emitted light is radiated from the surface of the substrate at an interface between the perimeter edge of the substrate and a shadow cast by the shadow ring.

9. The method of claim 1, wherein the light source is a laser or a lamp.

10. The method of claim 1, wherein the thermal sensor is a pyrometer.

11. The method of claim 1, further comprising detecting an edge of the energy blocker within the treatment region to determine the dimensions of the surface of the substrate radiating the portion of the emitted light.

12. The method of claim 1, wherein the substrate support is a moveable substrate support.

13. A method for measuring a temperature of a substrate surface, comprising:
 exposing a surface of a substrate to a laser beam radiating from a laser source, wherein the substrate is disposed on a substrate support within a treatment region and a shadow ring is disposed between the laser source and the surface of the substrate, and the shadow ring is opaque to the laser beam;
 radiating emitted light from the surface of the substrate, a portion of the emitted light passing through the shadow ring, and towards a thermal sensor; and
 determining a temperature of the surface of the substrate below the shadow ring from the portion of the emitted light.

14. The method of claim 13, wherein the emitted light has a wavelength of less than 800 nm or greater than 815 nm.

15. The method of claim 14, wherein the emitted light has a wavelength of less than 750 nm or greater than 875 nm.

16. The method of claim 13, wherein the laser beam has a wavelength within a range from about 750 nm to about 875 nm.

17. The method of claim 16, wherein the wavelength is within a range from about 800 nm to about 815 nm.

18. The method of claim 13, wherein the shadow ring comprises quartz and contains an optical coating of multiple dielectric layers.

19. The method of claim 13, wherein the thermal sensor is a pyrometer.

20. The method of claim 13, further comprising detecting an edge of the shadow ring within the treatment region to determine the dimensions of the surface of the substrate radiating the portion of the emitted light.

21. A method for measuring a temperature of a substrate surface, comprising:
 positioning a substrate on a substrate support and below a shadow ring, wherein the shadow ring is opaque to a first light and transparent to a second light;
 exposing an upper surface of the substrate to the first light radiating from a light source;
 emitting the second light from the surface of the substrate, a portion of the emitted light passing through the shadow ring, and towards a pyrometer; and
 determining a temperature of the surface of the substrate below the shadow ring from the portion of the emitted light with the pyrometer.

22. A processing apparatus for treating a substrate and measuring a surface temperature of the substrate, comprising:
 a substrate support disposed within a processing body;
 a laser source positioned to direct a laser beam having a first wavelength towards the substrate support;
 an optical assembly containing a thermal sensor and coupled with the processing body, wherein the thermal sensor is configured to detect light emitted from a substrate at a second wavelength; and
 an energy blocker disposed between the laser source and the substrate support and coupled with the processing body, wherein the energy blocker is a shadow ring or an edge ring and is opaque to the first wavelength and transparent to the second wavelength, wherein the first wavelength is within a range from about 750 nm to about 875 nm and the second wavelength is less than 800 nm or greater than 810 nm.

23. The processing apparatus of claim 22, wherein the energy blocker comprises quartz and contains an optical coating of multiple dielectric layers.

24. The processing apparatus of claim 22, wherein the thermal sensor is a pyrometer.

* * * * *